(12) United States Patent
Amano et al.

(10) Patent No.: US 8,581,476 B2
(45) Date of Patent: Nov. 12, 2013

(54) QUARTZ-CRYSTAL DEVICES AND METHODS FOR MANUFACTURING SAME

(75) Inventors: Yoshiaki Amano, Saitama (JP);
Takehiro Takahashi, Saitama (JP);
Shuichi Mizusawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 300 days.

(21) Appl. No.: 13/051,730

(22) Filed: Mar. 18, 2011

(65) Prior Publication Data
US 2011/0234052 A1  Sep. 29, 2011

(30) Foreign Application Priority Data

Mar. 25, 2010 (JP) ................. 2010-069100
Sep. 17, 2010 (JP) ................. 2010-208695
Jan. 26, 2011 (JP) ................. 2011-014173

(51) Int. Cl.
*H03H 9/17* (2006.01)

(52) U.S. Cl.
CPC ....................... *H03H 9/172* (2013.01)
USPC ........................................................ 310/348

(58) Field of Classification Search
CPC ........... H03H 9/15; H03H 9/17; H03H 9/171;
H03H 9/172; H03H 9/173; H03H 9/21;
H03H 9/215
USPC .................. 310/340, 344, 348, 370
See application file for complete search history.

(56) References Cited

U.S. PATENT DOCUMENTS

| 2010/0033061 | A1* | 2/2010 | Ichikawa et al. | 310/344 |
| 2010/0308697 | A1* | 12/2010 | Aratake et al. | 310/348 |
| 2011/0215678 | A1* | 9/2011 | Kohda et al. | 310/344 |

FOREIGN PATENT DOCUMENTS

| JP | 2005-109886 | | 4/2005 | |
| WO | WO 2010/074127 | * | 7/2010 | ............... H03H 9/02 |

\* cited by examiner

*Primary Examiner* — Derek Rosenau
(74) *Attorney, Agent, or Firm* — Klarquist Sparkman, LLP

(57) ABSTRACT

Methods are disclosed for manufacturing quartz-crystal devices. In an exemplary method three wafers are prepared. One is a quartz-crystal wafer defining multiple quartz-crystal pieces; a second is a wafer defining multiple package bases; and a third is a wafer defining multiple lids for the package bases. Each quartz-crystal piece has a respective excitation portion that vibrates when electrically energized and a respective frame portion surrounding the excitation portion. The quartz-crystal wafer has main surfaces that are lapped and polished to mirror-finish them. The base wafer defines multiple package bases each having a floor surface, a bonding surface surrounding the floor surface, and a lower main surface. The lid wafer defines multiple lids each having a ceiling surface, a bonding surface surrounding the ceiling surface, and a upper main surface. The quartz-crystal wafer is sandwiched between the base and lid wafers. The wafers are bonded together by bonding respective main surfaces of the frame portion to respective bonding surfaces. At least two of the upper main surface, lower main surface, floor surface, and ceiling surface are rougher than the surfaces of the excitation portion.

16 Claims, 15 Drawing Sheets

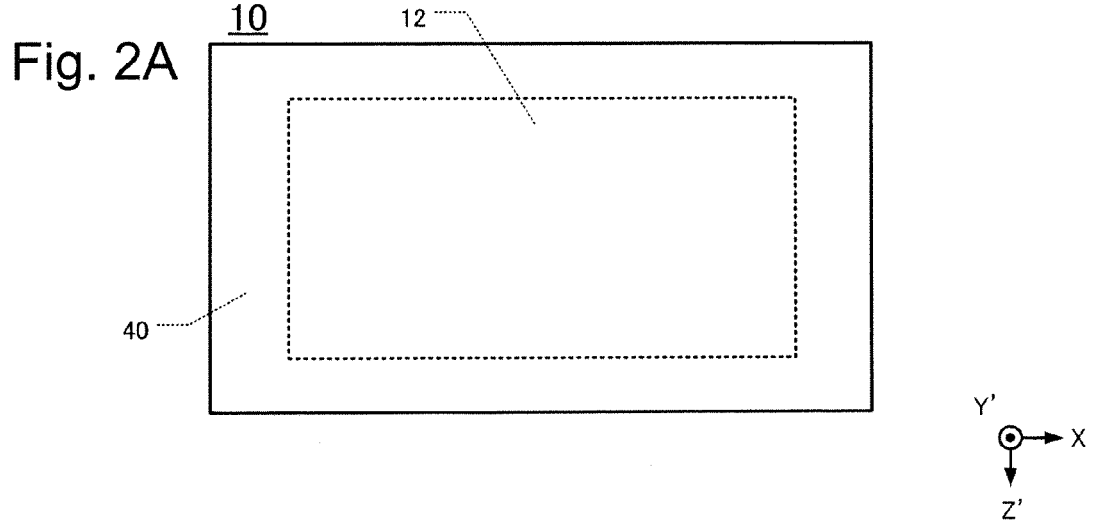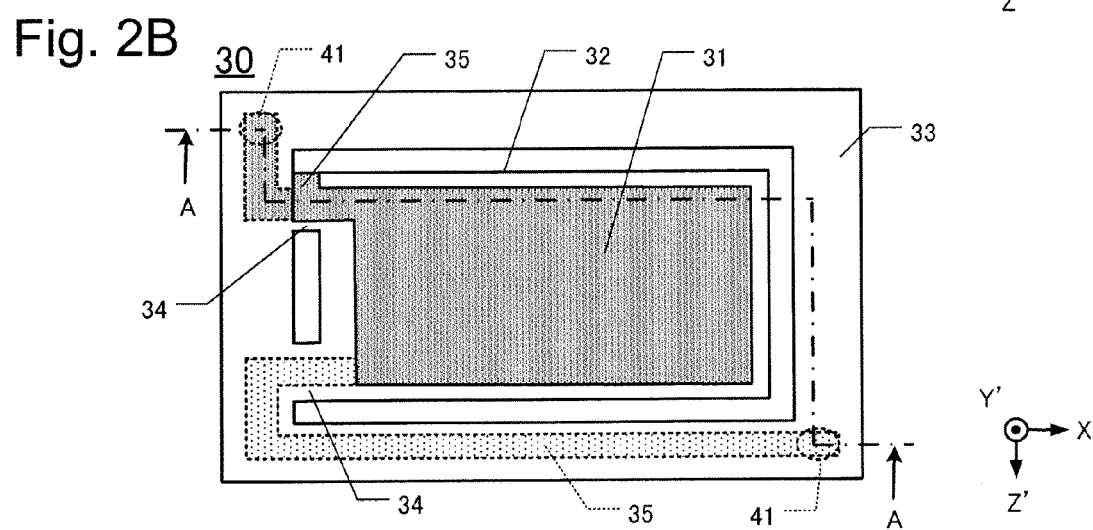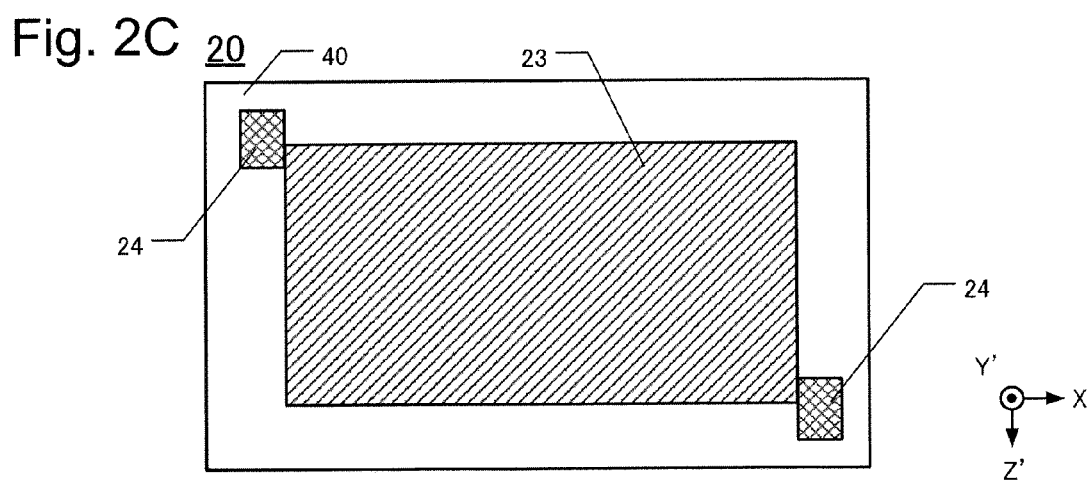

Fig. 5
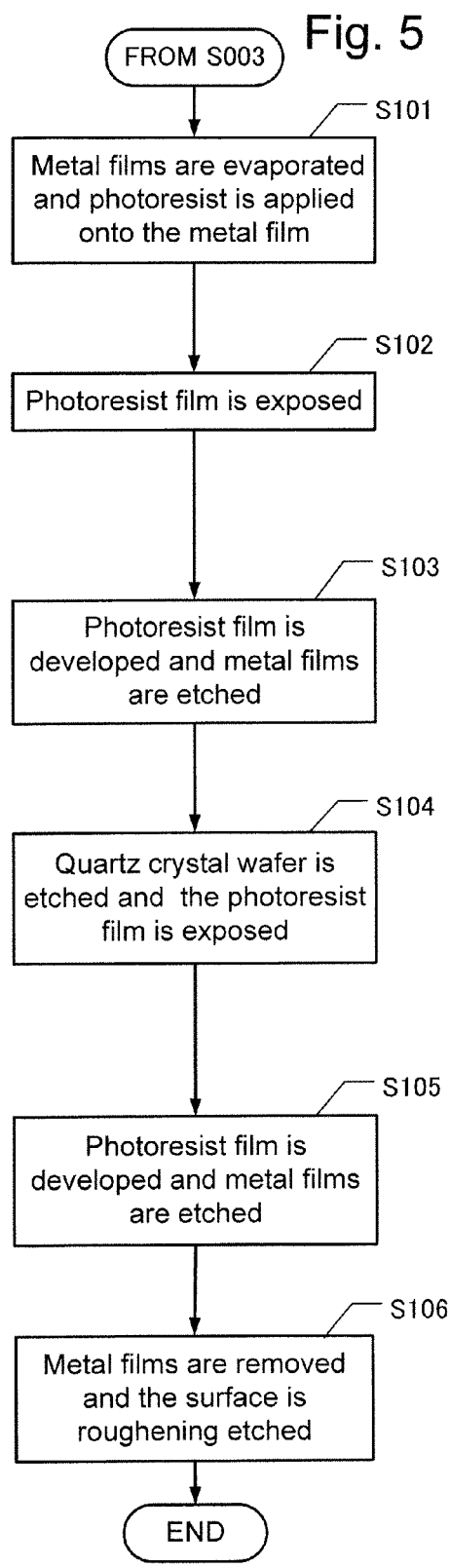
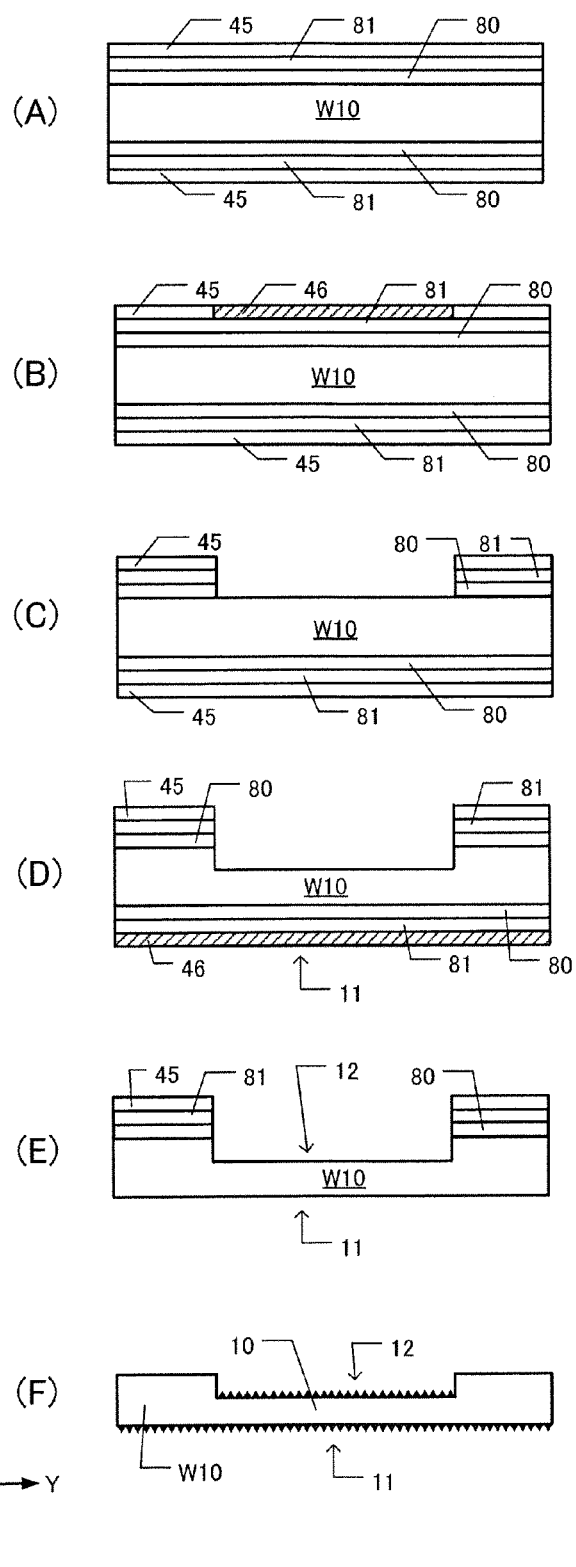

Fig. 6
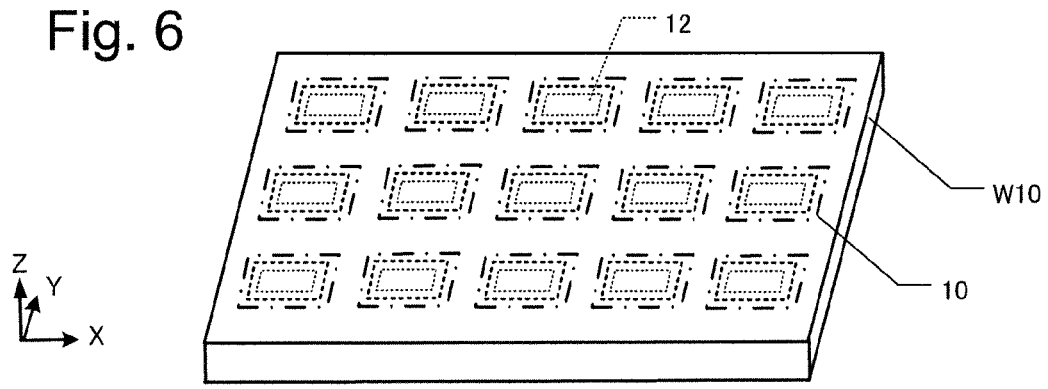
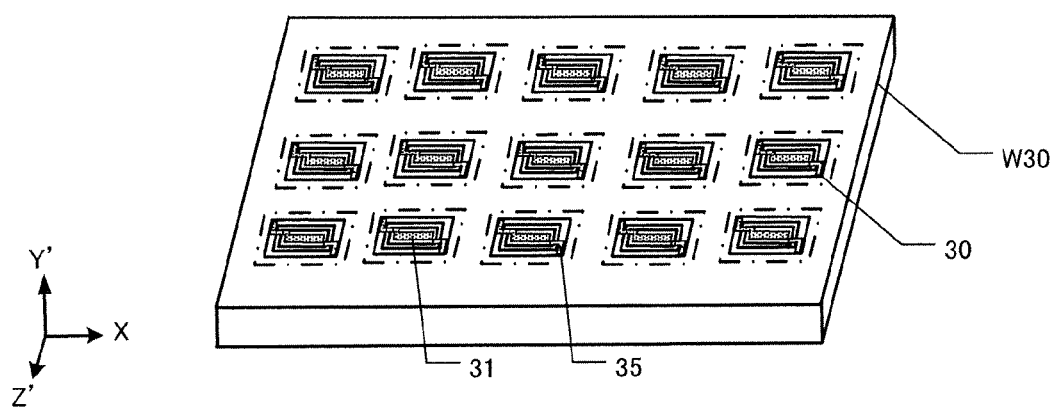
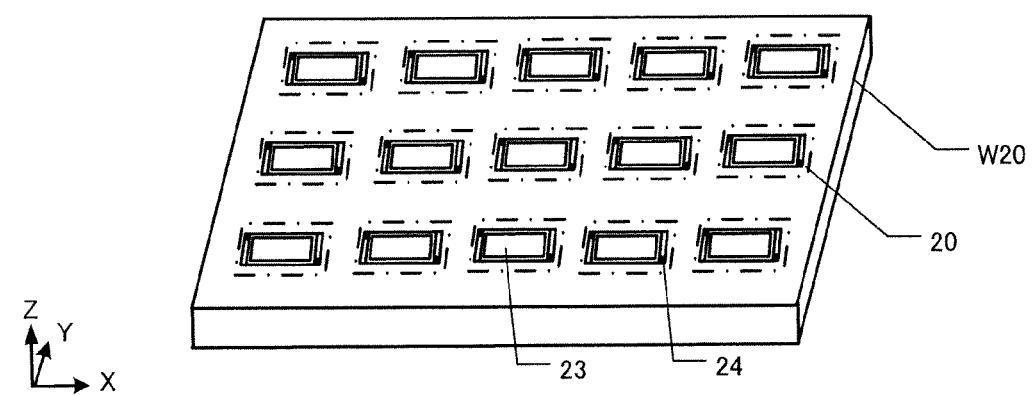

QUARTZ-CRYSTAL DEVICES AND METHODS FOR MANUFACTURING SAME

CROSS-REFERENCE TO RELATED APPLICATIONS

This application claims priority to and the benefit of Japan Patent Application No. 2010-069100, filed on Mar. 25, 2010, Japan Patent Application No. 2010-208695, filed on Sep. 17, 2010, and Japan Patent Application No. 2011-014173, filed on Jan. 26, 2011, in the Japan Patent Office, the disclosures of which are incorporated herein by reference in their respective entireties.

FIELD

This disclosure is directed to, inter alia, quartz-crystal devices of surface-mountable type (Surface Mount Device, "SMD") that exhibit reduced influence from thermal expansion. The disclosure also is directed to methods for manufacturing such quartz-crystal devices.

DESCRIPTION OF THE RELATED ART

A conventional surface-mountable quartz-crystal device generally comprises a package base, a quartz-crystal vibrating piece mounted to the package base, and a lid mountable to the package base so as to create a sealed package containing the vibrating piece. For example, in Japan Unexamined Patent Publication No. 2005-109886, the package base and lid are made of glass or quartz crystal, which is advantageous from the viewpoint of cost reduction and mass productivity. Since the quartz-crystal vibrating piece is enclosed by the package base and lid, JP '886 also discusses bringing the respective thermal expansion coefficients of the material(s) used for the package base and lid as close as possible to the thermal expansion coefficient of the quartz-crystal vibrating piece.

However, the respective thermal expansion coefficients of quartz crystal and glass are not necessarily equal. Even if both the package base and lid are made of quartz crystal, if the crystal-lattice orientation of the quartz crystal used for fabricating the vibrating piece is different from the crystal-lattice orientation of the quartz crystal used for fabricating the package base, the thermal expansion coefficients of these components are not strictly equal. Therefore, whenever it experiences a large temperature difference, the quartz-crystal device may fracture. Moreover, as surface-mountable piezoelectric devices continue to be further miniaturized, the quartz crystal or glass must be correspondingly thinner. It is frequently not desirable or practical to increase the thicknesses of the package base and the lid to minimize thermal fractures.

SUMMARY

The present invention provides, inter alia, quartz-crystal devices that exhibit reduced thermal-expansion influences, as well as methods for manufacturing such quartz-crystal devices.

A first aspect of the invention is directed to quartz-crystal devices. An embodiment of such a device comprises a quartz-crystal piece, a package base, and a lid, all bonded together. The quartz-crystal piece comprises an excitation portion that vibrates whenever a voltage is impressed across the excitation portion. The vibration portion has a designated surface-roughness. The package base is fabricated of glass or synthetic quartz crystal. If made of quartz crystal, it has a similar crystal-lattice orientation as the quart-crystal piece. The package base has an inner main surface and an opposing outer main surface, wherein the quartz-crystal piece is mounted on the inner main surface. The lid is fabricated of glass or synthetic quartz crystal having a crystal-lattice orientation. The lid has an inner main surface and an outer main surface. The inner main surface is bonded to the inner main surface of the package base to form a package in which the quartz-crystal piece is sealed in a space (void) defined between the package base and lid. At least two of the four main surfaces are rougher than the surface-roughness of the excitation portion.

The quartz-crystal piece can include a frame portion circumferentially surrounding the excitation portion. The frame portion includes first and second bonding surfaces to which the package base and lid can be bonded to. These bonds can be between similar materials or materials having different respective crystal-lattice orientations. Locations on the package base and lid that are bonded have less surface-roughness than locations that are not bonded.

The excitation portion can comprise a quartz-crystal vibrating piece that vibrates in a thickness-shear mode or a tuning-fork type quartz-crystal vibrating piece having a pair of vibrating arms.

A quartz-crystal device according to another embodiment comprises a quartz-crystal piece, a package base, and a lid. The quartz-crystal piece comprises a frame portion and an excitation portion. The frame portion circumferentially surrounds the excitation portion and includes upper and lower bonding surfaces. The excitation portion has a designated surface roughness and vibrates whenever a voltage is impressed across it. The package base is fabricated of glass or quartz crystal material. The package base comprises a floor surface, a bonding surface circumferentially surrounding the floor surface, and an outer main surface. The floor surface faces the quartz-crystal piece, and the bonding surface is bonded to the lower bonding surface of the frame portion. The lid is fabricated of glass or quartz crystal, and comprises a ceiling surface, a bonding surface circumferentially surrounding the ceiling surface, and an outer main surface. The ceiling surface faces the quartz-crystal piece, and the bonding surface is bonded to the upper bonding surface of the frame portion. At least two of the upper main surface, ceiling surface, floor surface, and lower main surface are rougher than the surface-roughness of the excitation portion.

The lid and package base desirably are bonded to the frame portion as respective bonds of different materials or different crystal orientations. For example, the lid and package base can each be fabricated of a unit of Z-cut quartz crystal having an X-axis, a Y-axis, and a Z-axis, while the quartz-crystal piece is fabricated of a unit of AT-cut quartz crystal having an X-axis, a Y'-axis, and a Z'-axis.

The quartz-crystal piece, the package base, and the lid can have different respective surface-roughnesses, and the excitation portion can comprise a quartz-crystal vibrating piece that vibrates in a thickness-shear mode or a tuning-fork type quartz-crystal vibrating piece having a pair of vibrating arms.

According to a third aspect of the invention, methods are provided for manufacturing quartz-crystal devices. An embodiment of such a method comprises cutting a quartz-crystal wafer from a respective unit of synthetic quartz crystal, wherein the quartz-crystal wafer has first and second main surfaces. The first and second main surfaces of the quartz-crystal wafer are mirror-polished. The quartz-crystal wafer is processed to form thereon multiple quartz-crystal pieces each comprising a respective frame portion and a respective excitation portion. The frame portion circumferentially surrounds the excitation portion, and has first and second opposing bonding surfaces. The excitation portion has first and second surfaces having a designated surface-roughness, and exhibits vibration whenever a voltage is impressed across the first and second surfaces. The method also includes cutting a quartz-crystal base wafer from a respective unit of synthetic quartz crystal, wherein the base wafer has first and second main surfaces. The base wafer is processed to form thereon multiple package bases each having a floor surface, a bonding surface circumferentially surrounding the floor surface, and a lower main surface opposite the floor surface. The method also includes cutting a quartz-crystal lid wafer from a respective unit of synthetic quartz crystal, wherein the lid wafer having first and second main surfaces. The lid wafer is processed to form thereon multiple lids each having a ceiling surface, a bonding surface circumferentially surrounding the ceiling surface, and an upper main surface opposite the ceiling surface. The lid wafer and base wafer are aligned with each other and with the quartz-crystal wafer to form a sandwich of the quartz-crystal wafer between the lid wafer and the base wafer. The base wafer is bonded to the quartz-crystal wafer by bonding the respective bonding surface of each package base on the base wafer to the first bonding surface of each respective frame portion on the quartz-crystal wafer. The lid wafer is bonded to the quartz-crystal wafer by bonding the respective bonding surface of each lid on the lid wafer to the second bonding surface of each respective frame portion on the quartz-crystal wafer. At least two of the upper main surface, the lower main surface, the floor surface, and the ceiling surface are rougher than the surface-roughness of the excitation portion.

Certain embodiments of the method further comprise wet-etching the first and second main surfaces of at least one of the base wafer and lid wafer after the respective cutting step.

In other embodiments, after the respective cutting step the first and second main surfaces of at least one of the base wafer and lid wafer are lapped using an abrasive of 3000 mesh or less. After lapping the first and second main surfaces of at least one of the base wafer and lid wafer are wet-etched to a depth no greater than 10 µm.

The respective cutting steps can comprise cutting the base wafer and the lid wafer using a technique that provides the respective first and second main surfaces with a surface-roughness of 1000 mesh. The lapping step can comprise lapping the base wafer with an abrasive to reduce its thickness and to provide its first and second main surfaces with a surface-roughness of 2000 mesh or less. In such embodiments the wet-etching step can comprise wet-etching the base-wafer to a depth of 5 µm.

In certain embodiments the wet-etching step further comprises, after cutting the lid wafer, wet-etching the first and second main surfaces of the lid wafer to a depth of 5 µm, in parallel with etching the base wafer.

In certain embodiments the base wafer and the lid wafer are each cut by an AT-cut specified with an X-axis, a Y'-axis, and a Z'-axis.

Certain embodiments of the method further comprise, after cutting each of the base wafer and lid wafer, lapping and polishing the respective first and second main surfaces of each so as to mirror-polish each of said main surfaces. At least two of the upper main surface, the lower main surface, the floor surface, and the ceiling surface are surface-roughened by sand-blasting or etching said surfaces.

The base wafer and lid wafer, at time of being bonded together, can have respective surface roughnesses as obtained during the respective cutting step.

According to the present invention, quartz-crystal devices are provided that exhibit less adverse consequences of thermal expansion. The subject methods are simpler and more cost-effective than conventional methods.

BRIEF DESCRIPTION OF THE DRAWINGS

FIG. 2A is a plan view of a lid used in the first embodiment.

FIG. 2B is a plan view of the quartz-crystal piece of the first embodiment.

FIG. 2C is a plan view of a package base of the first embodiment.

FIG. 5 is a flow-chart of an embodiment of a method for forming the lids on the lid wafer.

FIG. 6 shows the lid wafer, the base wafer, and the wafer for forming quartz-crystal pieces, wherein the wafer for forming quartz-crystal pieces is sandwiched between the lid wafer and base wafer.

DETAILED DESCRIPTION

Various representative embodiments are described below with reference to the respective drawings. It will be understood that the scope of the invention is not limited to the described embodiments, unless otherwise stated.

First Embodiment of Quartz-Crystal Oscillator

Figure 1A:
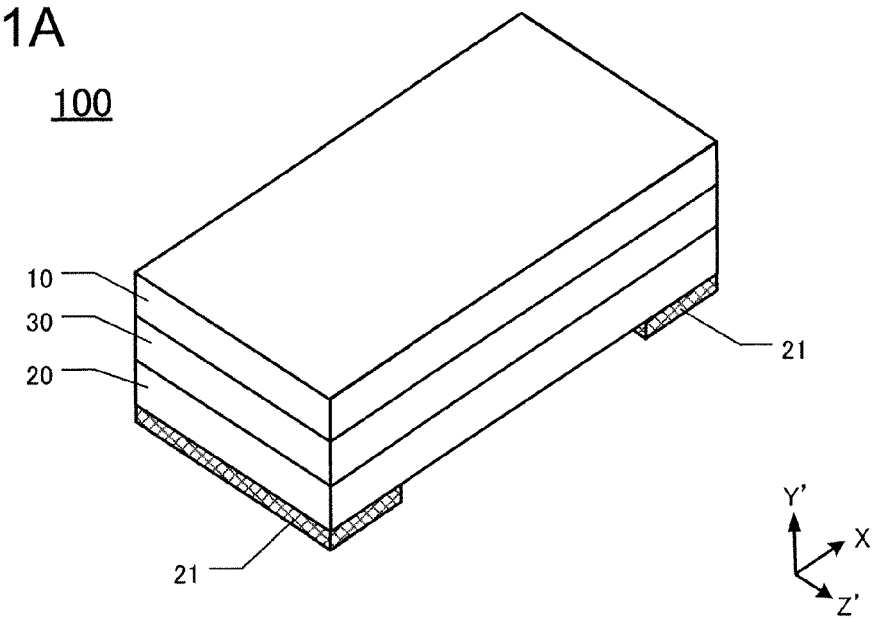
FIG. 1A is a perspective view of a first embodiment of a quartz-crystal oscillator 100, as an exemplary surface-mountable quartz-crystal device.
Figure 1B:
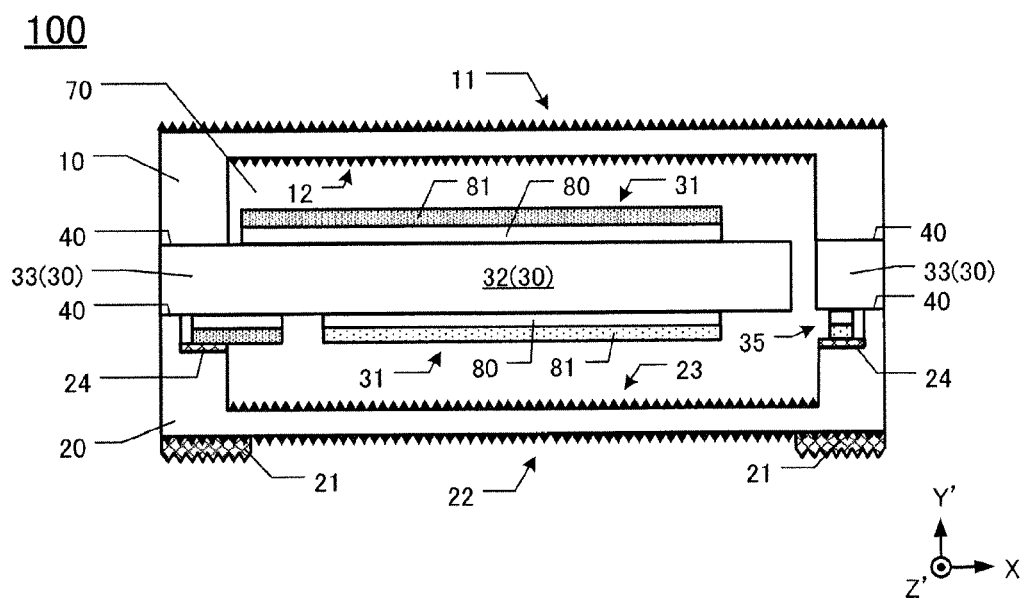
FIG. 1B is a cross-sectional view of the first embodiment of a quartz-crystal oscillator.

This embodiment, shown in FIGS. 1A and 1B, is an exemplary surface-mountable type of quartz-crystal device, specifically a quartz-crystal oscillator 100. The quartz-crystal oscillator 100 comprises a lid 10, a package base 20, and a quartz-crystal piece 30 fabricated from a unit of synthetic quartz crystal. The oscillator 100 is configured such that the lid 10 constitutes an upper portion and the package base 20 constitutes a lower portion. The quartz-crystal piece 30 is sandwiched between the lid 10 and the package base 20. External electrodes 21 are formed on the lower main surface 22 of the package base 20.

An exemplary unit of quartz-crystal material used for fabricating the quartz-crystal piece 30 is synthetic AT-cut quartz crystal. AT-cut quartz crystal has a principal plane (YZ plane) that is inclined, with respect to the Y-axis of the crystal axes (XYZ), from the Z-axis to the Y-axis direction by 35° 15'. In the explanation below, inclined new axes are denoted as the Y'-axis and the Z'-axis, based on the axial direction of the AT-cut quartz crystal. That is, the quartz-crystal oscillator 100 is described below by designating a longitudinal direction thereof as the X-axis direction, designating the height direction thereof as the Y'-axis direction, and designating the direction thereof that is perpendicular to the X-axis and Y'-axis directions as the Z'-axis direction.

FIG. 1B is a cross-sectional view of the quartz-crystal oscillator 100. FIG. 1B is a cross-sectional view along the line A-A of FIG. 2B. The quartz-crystal piece 30 has an excitation portion 32 on which excitation electrodes 31 are formed and a frame member 33 for surrounding the excitation portion 32. The lid 10 has two principal planes: the upper main surface 11 which is an exterior main surface of the oscillator 100 and a "ceiling" surface (inner main surface) 12 that faces the quartz-crystal piece 30. The lid 10 includes a bonding surface 40 used for bonding the lid 10 to the frame member 33 of the quartz-crystal piece 30. The ceiling surface 12 is recessed from the bonding surface 40. The upper main surface 11 and the ceiling surface 12 are surface-roughened.

The package base 20 has two principal planes: the lower main surface 22 (which is an external main surface of the oscillator 100) and a "floor" surface (inner main surface) 23 that faces the quartz-crystal piece 30. The package base 20 includes a bonding surface 40 for bonding the package base 20 to the frame member 33 of the quartz-crystal piece 30. The floor surface 23 is recessed from the bonding surface 40. The bonding surface 40 of the package base 20 includes connection electrodes 24, and external electrodes 21 are formed on the lower main surface 22. The connection electrodes 24 are electrically connected to respective external electrodes 21 via conductors (not shown) inside the package base 20. The lower main surface 22 and the floor surface 23 are surface-roughened to provide them with a specified degree of surficial unevenness. Since the external electrodes 21 are formed on the lower main surface 22, they also have a surficial unevenness substantially the same as the lower main surface 22. The excitation portion 32 of the quartz-crystal piece 30 is situated in a cavity 70 defined in part by and located between the ceiling surface 12 and the floor surface 23.

Respective excitation electrodes 31 are formed on the upper and lower surfaces of the excitation portion 32 of the quartz-crystal piece 30, and corresponding extraction electrodes 35 are formed on the frame member 33. The excitation electrodes 31 are electrically connected to respective extraction electrodes 35. Thus, the extraction electrodes 35 are connected via the connection electrodes 24 to the external electrodes 21. Each excitation electrode 31 comprises a first metal layer 80 formed on the quartz-crystal surface and a second metal layer 81 formed on the first metal layer 80. The first metal layer 80 desirably is of chromium (Cr), and the second metal layer 81 desirably is gold (Au).

FIG. 2A is a plan view of the lid 10. The lid 10 has a rectangular principal plane that extends longitudinally in the X-axis direction, with the shorter sides extending in the Z'-axis direction. The upper main surface 11 of the lid 10, which is a +Y'-side principal plane of the lid, is surface-roughened. Also surface-roughened is the ceiling surface 12, which is a −Y'-side principal plane of the lid. The bonding surface 40 (see FIG. 1B) is destined to be bonded circumferentially to the −Y-side surface of the quartz-crystal piece 30. The bonding surface 40 is not surface-roughened.

FIG. 2B is a plan view of the quartz-crystal piece 30. The excitation portion 32 and the frame member 33 are connected together by connection portions 34. The extraction electrodes 35 extend over the connection portions 34 to respective −Y'-side corners of the frame member 33. The extraction electrodes 35 are connected to respective connection electrodes 24 via respective junctions 41 situated at respective corners of the frame member 33.

FIG. 2C is a plan view of the rectangular package base 20. The lower main surface 22, which is a −Y'-side principal plane of the package base 20, is surface-roughened. Also surface-roughened is the floor surface 23 (indicated by hatching in FIG. 2C), which is a +Y'-side principal plane of the package base. The peripheral region of the Y'-side surface includes the bonding surface 40 (see FIG. 1B) destined to be bonded to the quartz-crystal piece 30; the bonding surface 40 is also surface-roughened. At respective corners (included in the peripheral region) on the +Y'-side surface of the package base 20 are the connection electrodes 24 that are electrically connected to respective junctions 41 of the extraction electrodes 35.

Material for Lids and/or Package Bases

The lid 10, the quartz-crystal piece 30, and the package base 20 of the quartz-crystal oscillator 100 can be made of any of various materials. If AT-cut crystal is used for the quartz-crystal piece 30, it is desirable to use the same material for the lid 10 and package base 20, so as to reduce possible fracture of the quartz-crystal oscillator 100 by thermal expansion. By using the same material for these components, their respective coefficients of thermal expansion are equalized. On the other hand, it is desirable to use material that is as inexpensive as possible for the lid 10 and package base 20, and such a material will not be AT-cut quartz crystal. Two examples are described below; one in which the lid and package base were made of AT-cut quartz crystal, and another in which the lid and package base were made of another material.

The first example is of a rectangular quartz-crystal vibrating piece. Z-cut quartz crystal is used for the lid 10 and the package base 20, and AT-cut quartz crystal is used for the quartz-crystal piece 30. Z-cut quartz crystal is defined by the following crystallographic axes: the X-axis (electrical axis), the Y-axis (mechanical axis), and the Z-axis (optical axis). AT-cut quartz crystal is defined by the following crystallographic axes: the X-axis; a Y'-axis; and a Z'-axis, wherein the Y'-axis and the Z'-axis are rotated about the X-axis as a center. Z-cut quartz crystal and the AT-cut quartz crystal have different respective thermal expansion coefficients because their cutting directions are different, although they are both quartz crystal.

The second example is of a rectangular quartz-crystal oscillator. Glass is used for the lid 10 and the package base 20, and AT-cut quartz crystal is used for the quartz-crystal piece 30. The glass desirably contains metal ions (e.g., Pyrex™ glass, any of various borosilicate glasses, or any of various soda glasses) because such a glass facilitates anodic bonding (explained later below).

In the foregoing two examples, since a comparatively inexpensive material is used for the lid 10 and package base 20, the unit price of the product can be reduced. However, in instances in which the same material (albeit of different crystal-lattice orientations) are bonded together, there is a possibility that any one of the lid 10, quartz-crystal piece 30, and the package base 20 may become fractured due to the materials' respective different thermal expansion coefficients. Similarly, in instances in which different materials are bonded together, there is a possibility that any one of the lid 10, the quartz-crystal piece 30, and the package base 20 may become fractured due to the materials' respective different thermal expansion coefficients.

Selected surface areas in the quartz-crystal oscillator 100 are increased by surface-roughening (e.g., on the lid 10 and package base 20) to relax stresses that otherwise would concentrate on the lid 10 and package base 20. More specifically, it is desirable that at least two surfaces of the upper main surface 11, the lower main surface 22, the floor surface 23, and the ceiling surface 12 be roughened to a degree greater than the surface-roughness of the excitation portion 32. It is desirable that the lower main surface 22 be roughened because the resulting surficial unevenness is also imparted to the respective external electrodes 21, which facilitates adhesion of solder to the external electrodes 21 by an anchoring effect.

Embodiment of Method for Manufacturing Quartz-Crystal Oscillator

Regarding the quartz-crystal oscillator 100, the surfaces of the lid 10 and package base 20 are surface-roughened. By performing surface-roughening simultaneously with forming the outline profiles of the lid 10 and package base 20, the manufacturing process can be simplified. This embodiment of a method for manufacturing a quartz-crystal oscillator 100, that includes a lid 10 and package base 20 made of Z-cut quartz crystal and a quartz-crystal piece 30 made of AT-cut quartz crystal, is described with reference to FIGS. 3-6. The following discussion regarding the lid 10 and package base 20 is made referring to the crystallographic axes (XYZ) of the Z-cut quartz crystal.

Figure 3A:
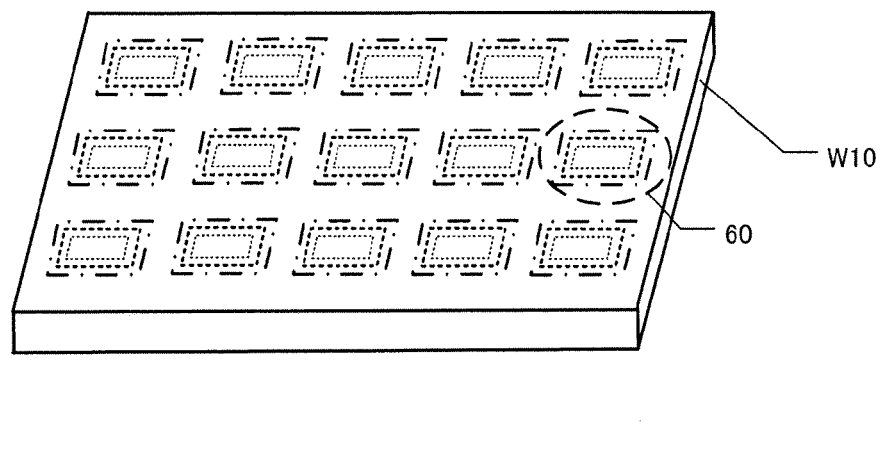
FIG. 3A is a plan view of a quartz-crystal "lid wafer" on which multiple lids are formed simultaneously.

FIG. 3A is a plan view of a quartz-crystal wafer W10 used for fabricating multiple lids 10. By way of example, the lid wafer W10 has a length in the Y-axis direction of 3 inches, 4 inches, or the like. Multiple lids 10 are formed simultaneously on the lid wafer W10. In the figure a single lid 10 is denoted within the region 60 denoted by dashed lines.

Figure 3B:
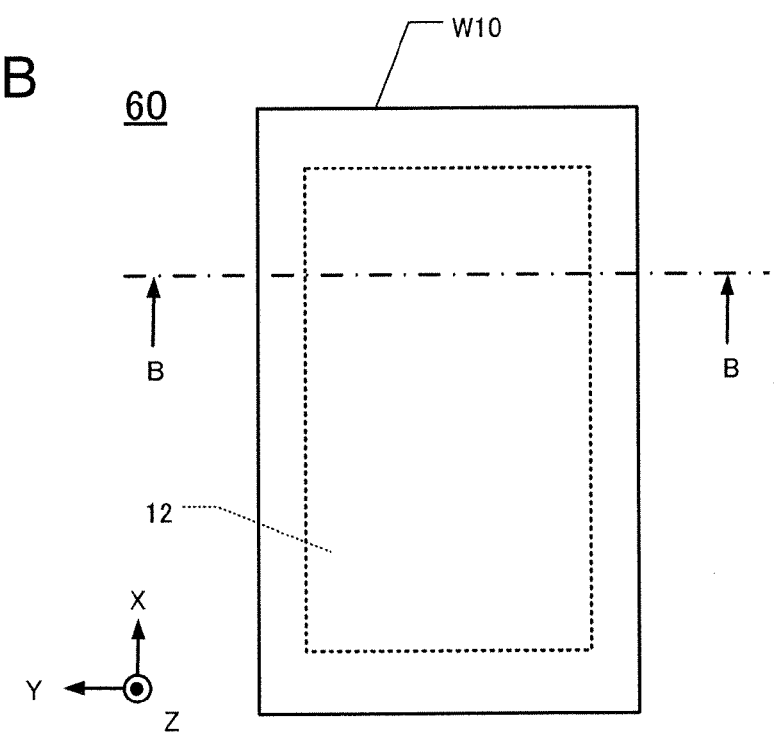
FIG. 3B is an enlarged view of the region 60 in FIG. 3A.

FIG. 3B is an enlarged view of the region 60 in FIG. 3A. The ceiling surface 12 of the lid 10 is formed on a surface of the quartz-crystal lid wafer W10, and surface-roughening is performed on the upper main surface 11 and on the ceiling surface 12 (both of these surfaces 11, 12 are the respective principal planes of the upper and lower surfaces of the lid wafer). Profile outlines of quartz-crystal pieces 30 are formed on a quartz-crystal wafer W30, and electrodes are formed on the quartz-crystal pieces 30 thus defined. Similarly, profile outlines of package bases 20 are formed on a quartz-crystal base wafer W20 for bases. The lower main surface 22 and floor surface 23 of the package bases are surface-roughened to a specified degree. By superposing the wafers (such that the quartz-crystal wafer 30 is aligned with and sandwiched between the lid wafer 10W and package wafer W20), bonding the wafers together to form a bonded-wafer sandwich, and dicing the sandwich to the dimensions of each of the multiple quartz-crystal oscillators 100 thus formed, it is possible to manufacture many quartz-crystal oscillators 100 simultaneously.

Figure 4A:
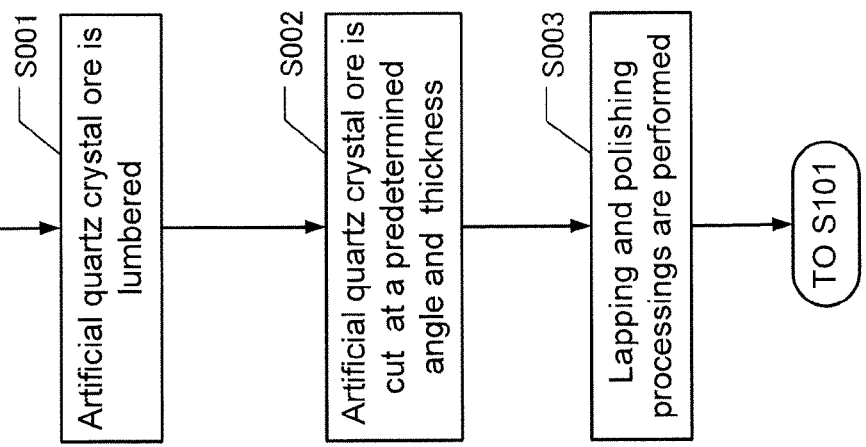
FIG. 4A is a flow-chart of an embodiment of a process for cutting the quartz-crystal lid wafer to make individual lids.

FIG. 4A is a flow-chart of a process for cutting a quartz-crystal wafer W10 for making a lid. In Step S001, synthetic quartz crystal is lumbered. Lumbering is a technique in which a unit of synthetic quartz crystal is cut into conveniently sized units and the crystallographic axes of the units are clarified.

In Step S002, the lid wafer W10 is cut from a lumbered unit of synthetic quartz crystal 50. The required cuts are made at a predetermined angle at a predetermined thickness. This cutting step yields wafer surfaces having a surface-roughness of 1000 mesh or less.

Figure 4B:
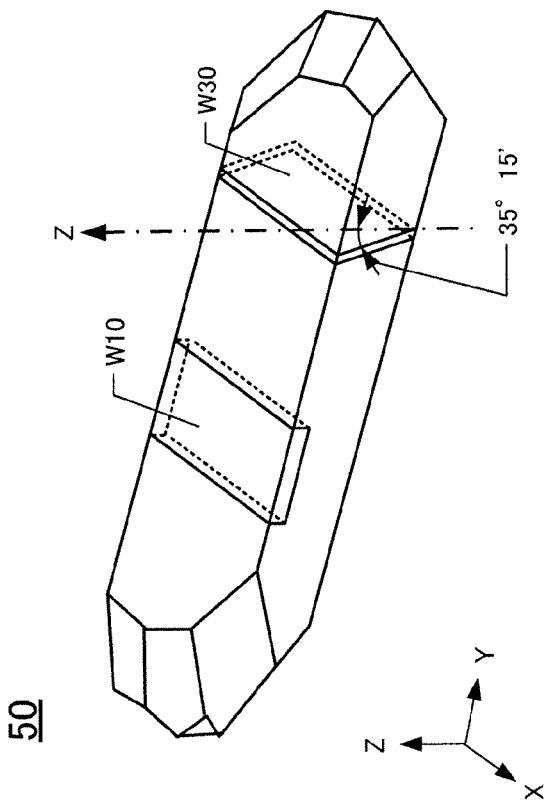
FIG. 4B is a perspective view of a unit of synthetic quartz crystal 50 that was lumbered.

FIG. 4B is a perspective view of a unit of synthetic quartz crystal 50 that was lumbered. FIG. 4B shows two cut examples, one for making a lid wafer W10 and another for making a wafer W30 for quartz-crystal pieces. Whenever the lid wafer W10 is Z-cut quartz crystal as shown, the resulting wafer W10 is parallel to the Z-plane (which is perpendicular to the Z-axis of the synthetic quartz crystal 50), as shown in FIG. 4B. Whenever the wafer W30 is AT-cut quartz crystal, the resulting wafer W30 is oriented, in a direction rotated, toward the Y-axis and relative to the Z-axis direction, by 35° 15' about the X-axis, wherein the X-axis is the rotation axis. Although FIG. 4B shows the lid wafer W10 and the quartz-crystal wafer W30 being cut from the same unit of synthetic quartz crystal 50, these wafers are normally cut from different units of quartz crystal 50 in actual practice.

In Step S003, the lid wafer W10 is lapped and polished. The goal of polishing is to provide a "mirror" finish to each of the main surfaces of the lid wafer. Lapping normally is performed before polishing, and is performed to establish a specified thickness of the wafer and to prepare the wafer surface for subsequent polishing. For making a quartz-crystal oscillator 100, a 3000-mesh abrasive is used for lapping, which yields a surface-roughness of about 1000 mesh to 3000 mesh. In the subsequent polishing, a finer abrasive is used.

FIG. 5 is a flowchart of a process for fabricating multiple lids 10 on a lid wafer W10 made of quartz crystal. FIGS. 5A to 5F depict the respective results of each step in FIG. 5, wherein each figure is a section along the B-B line in FIG. 3B. The upper part of the drawing is the −Z-direction.

In Step S101 a metal film is formed over both main surfaces of the lid wafer W10 by vacuum-evaporation or sputtering. Then a film of photoresist is applied to the metal film. The metal film comprises a first metal layer 80 and a second metal layer 81 formed on the first metal layer 80. The first metal layer 80 is chromium (Cr), and the second metal layer 81 is gold (Au). The photoresist is applied to the surface of the second metal layer 81 by spin-coating, etc., yielding a photoresist film 45 (see FIG. 5A).

In Step S102 the photoresist film 45 is exposed (see FIG. 5B). Exposure is performed using a photomask (not shown) defining the pattern of the ceiling surface 12 of the lid 10. Thus, exposed regions 46 are formed in the photoresist film 45.

In Step S103 the photoresist film 45 is developed and the exposed regions 46 are removed. Respective portions of the main surfaces of the lid wafer W10 are denuded (see FIG. 5C) by etching away corresponding regions of the metal film. Different etchants are used for each metal layer 80, 81. The Au layer 81 is etched using, for example, an aqueous solution of iodine and potassium iodide; the Cr layer 80 is etched using, for example, an aqueous solution of cerium diammonium nitrate and acetic acid.

In Step S104 denuded regions of the lid wafer W10 are etched to form the ceiling surface 12. Then, the photoresist film 45 on the +Z-side main surface is exposed, thereby forming exposed regions 46 of the photoresist (see FIG. 5D). This etching of the material of the quartz-crystal lid wafer W10 can be performed using buffered hydrofluoric acid (a liquid solution of 55% hydrofluoric acid buffered with ammonium, or the like).

In Step S105 the photoresist film 45 is developed, and the exposed regions 46 are removed. The thus denuded regions of the metal layers 80 and 81 on the upper main surface 11 denudes corresponding regions on the upper main surface 11 of the lid 10 (see FIG. 5E).

In Step S106 the ceiling surface 12 and the upper main surface 11 of the lid 10 are surface-roughened by etching. Then, the photoresist film 45 and underlying metal layers (80, 81) are removed (see FIG. 5F). Thus, the mirror-polished ceiling surface 12 and upper main surface 11 of the lid 10 acquire greater surface roughness than the mirror-finished surfaces. Surface-roughening etching is performed using potassium fluoride (KF) solution.

In the process described above, surface-roughening of both main surfaces 11, 12 of the lid wafer W10 is performed in a single step. Similarly, in a process for fabricating multiple package bases 20 on a base wafer, both main surfaces of the package bases can be roughened in a single step.

For forming the surface-roughened surfaces on the lid wafer W10 in Step S106, wet-etchants other than potassium fluoride (KF) alternatively can be used. For example, high-temperature (90° C.) hydrofluoric acid solution (e.g., 50%) can be used. Further alternatively, dry-etching using $CF_4$, $C_4F_8$, $CHF_3$, etc., can be performed to surface-roughen the surfaces of the lid wafer W10. Further alternatively, surface-roughening can be performed by sand-blasting, which involves impact of a stream of entrained abrasive particles onto the surfaces. Sand-blasting selected regions of a surface involves using a photomask.

Bonding Together the Lid, Package Base, and Quartz-Crystal Piece

FIG. 6 shows the quartz-crystal lid wafer W10, the quartz-crystal wafer W30 for quartz-crystal pieces, and the quartz-crystal base wafer W20 vertically aligned with each other for forming a sandwich thereof. For convenience of explanation, ghost lines are used to denote exemplary lids 10 in the lid wafer W10, exemplary quartz-crystal pieces 30 in the wafer W30, and exemplary package bases 20 in the base wafer W20. The wafer W30 for quartz-crystal pieces is an AT-cut quartz-crystal wafer; the lid wafer W10 and the base wafer W20 are each Z-cut quartz-crystal wafers. Incidentally, although fifteen lids 10 are drawn on the lid wafer W10 for convenience of explanation, in actual production, hundreds to thousands of lids 10 are formed on a single wafer. The same is true of the other two wafers W20, W30.

Regarding the wafers shown in FIG. 6, the lid wafer has undergone formation of the ceiling 12 and surface-roughening of the ceiling surface 12 and upper main surface 11; the quartz-crystal wafer W30 has undergone formation of the excitation portions 32, formation of respective excitation electrodes 31 on the excitation portions 32, and formation of respective extraction electrodes 35 extending from the excitation electrodes 31 to the frame member 33; and the base wafer W20 has undergone formation of the floor surface 23, formation of the external electrodes 21 and respective connection electrodes 24, and surface-roughening of the floor surface 23 and lower main surface 22.

The three co-aligned quartz-crystal wafers are brought together and bonded by siloxane bonding, described later. During siloxane bonding, and with respect to each crystal oscillator 100 formed by the wafer sandwich, the junction points 41 (see FIG. 2B) of the extraction electrodes 35 of the quartz-crystal piece 30 are firmly connected to the respective connection electrodes 24 (see FIG. 2C) of the package base 20.

At conclusion of siloxane bonding the quartz-crystal oscillators 100 are still attached to the wafer sandwich. Individual quartz-crystal oscillators 100 are removed from the sandwich by cutting using a dicing saw or laser saw. Thus, it is possible to improve productivity by performing packaging and bonding of electrodes simultaneously and by producing multiple quartz-crystal oscillators 100 simultaneously.

There are several methods for bonding wafers together in the wafer sandwich, as follows:

Siloxane Bonding

Figure 7A:
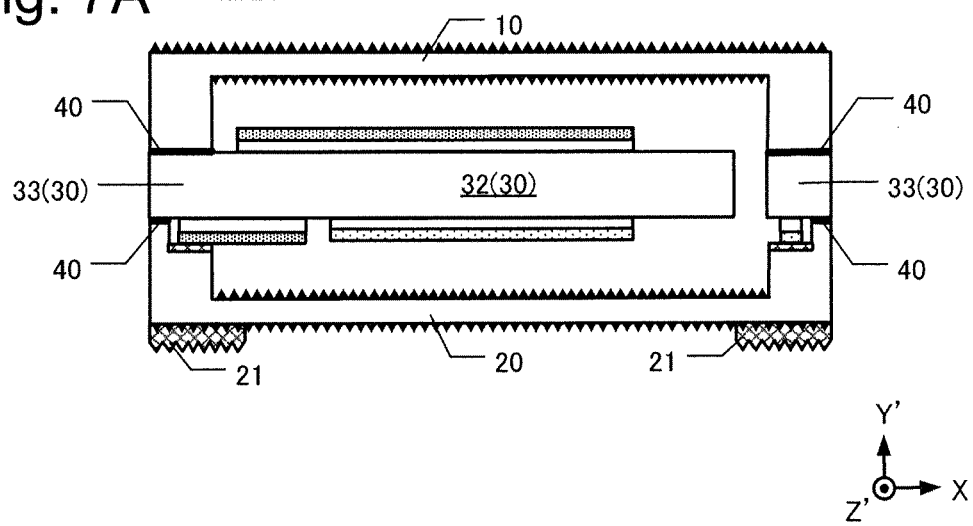
FIG. 7A is a diagram for explaining a siloxane bond.

FIG. 7A depicts siloxane bonding in a case in which an AT-cut quartz crystal is used for the quartz-crystal piece 30, and the lid 10 and package base 20 are made from Z-cut quartz crystal. The lid 10, quartz-crystal piece 30, and package base 20 are bonded together by forming siloxane (—Si—O—Si—) bonds. Incidentally, although the Z-cut wafers and the AT-cut wafer are quartz crystals having different respective crystal-lattice orientations, they are both readily bonded together by the siloxane bond.

To form a siloxane bond, respective "bonding surfaces" 40 of the package base 20, the quartz-crystal piece 30, and the lid 10 are mirror-finished and then irradiated by ultraviolet rays of a short wavelength in an oxygen-containing atmosphere to clean them. The cleaned bonding surfaces 40 are co-aligned and brought into contact with each other in a vacuum or inert-gas atmosphere, in which they are subjected to compression and heating to a relatively low temperature of about 100° C. to 200° C. These conditions form siloxane bonds between contacting surfaces. Alternatively to pretreatment by ultraviolet irradiation, other pretreatment methods are plasma-processing and ion-beam irradiation.

Anodic Bonding

Figure 7B:
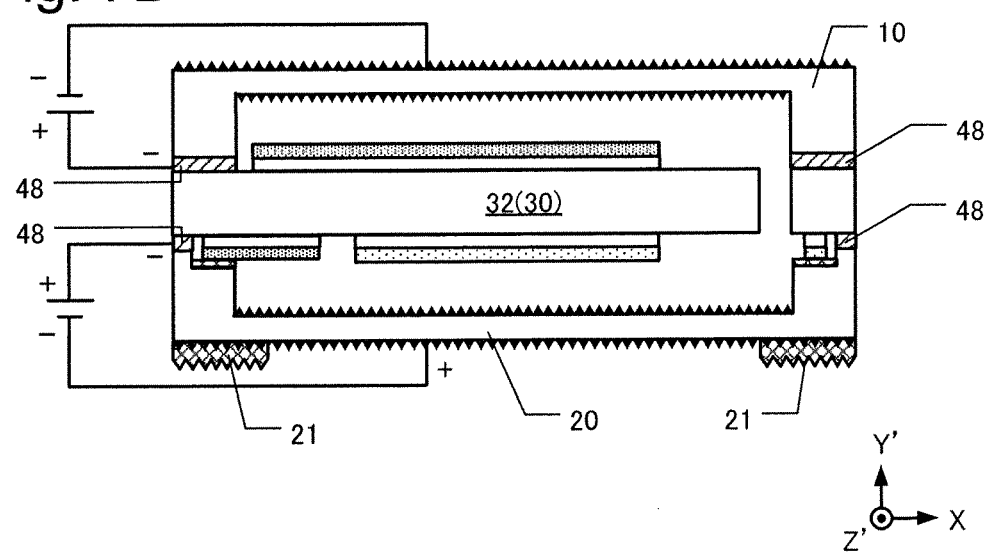
FIG. 7B is a diagram for explaining anodic bonding.

FIG. 7B depicts anodic bonding, which is a useful bonding method whenever glass is used for fabricating the lid 10 and package base 20. For effective anodic bonding the glass desirably contains metal ions. Examples of such glasses are Pyrex™ glass, borosilicate glass, and soda glass. For example, consider a case in which the lid 10 and package base 20 are made of the same glass and the quartz-crystal piece 30 is made of AT-cut quartz crystal. A metal layer 48 is formed on the first and second main surfaces of the outer frame of the quartz-crystal piece 30 by sputtering or vacuum evaporation. The metal layer 48 comprises, for example, a layer of aluminum (Al) having a thickness of about 1000 to 1500 Å. Alternatively, the metal layer 48 can be a gold layer formed on an underlying chromium layer, wherein the chromium layer is formed on the quartz-crystal piece.

The lid 10, package base 20, and quartz-crystal piece 30 are co-aligned, superposed, and compressed while being heated to a temperature ranging from 200 to 400° C. in a vacuum or inert-gas environment. Meanwhile, the upper main surface 11 of the lid 10 and the lower main surface 22 of the base 20 are set to a negative potential, the metal layer 48 is set to a positive potential, and a direct-current voltage of 500 V to 1 kV is impressed for 10 minutes. Since the lid 10, package base 20, and quartz-crystal piece 30 are formed on respective wafers, anodic bonding in actual production is formed by applying the negative potential to the lid wafer W10 and base wafer W20 and applying the positive potential to the metal layer 48.

Anodic bonding occurs by a chemical reaction involving oxidation of the metal located in the bonding interfaces. During anodic bonding the metal layer 48 is used as an anode and the glass surface facing the bonding surface 40 is used as a cathode, and an electric field is imposed between the anode and cathode. Thus, metal ions, such as sodium ions, in the glass migrate toward the cathode, which oxidizes the metal film contacting the glass in the bonding interface and bonds the surfaces together.

Adhesion Using a Sealant

If the lid 10 and package base 20 are made of ceramic or if the glass does not contain metal ions, the lid 10 and package base 20 can be bonded to respective main surfaces of the quartz-crystal piece 30 using a polyimide adhesive or the like.

First Alternative Embodiment of Quartz-Crystal Oscillator

Figure 8A:
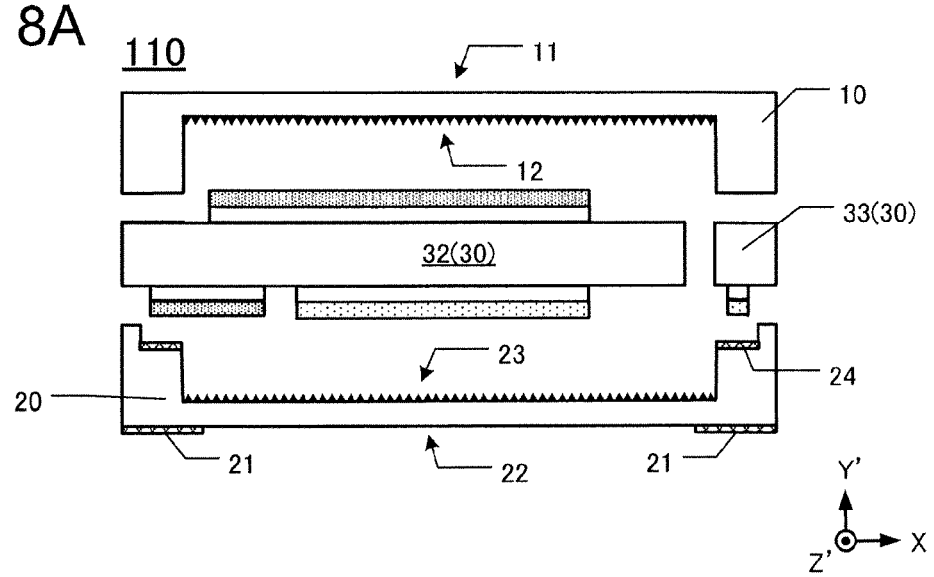
FIG. 8A is a cross-sectional view of a first alternative embodiment of a quartz-crystal oscillator.

FIG. 8A is a cross-sectional view of this embodiment 110 of a quartz-crystal oscillator 110, in which the lid 10 and package base 20 are shown vertically separated from (but still aligned with) the quartz-crystal piece 30. The ceiling surface 12 of the lid 10 and the floor surface 23 of the package base 20 have been roughened. Roughening these surfaces is effective for relaxing stresses, even during processing of these surfaces. But, the upper main surface 11 of the lid and the lower main surface 22 of the package base are not roughened. This eliminates steps S104 and S105 in FIG. 5 as applied to the lid 10 and to the package base 20.

Second Alternative Embodiment of Quartz-Crystal Oscillator

Figure 8B:
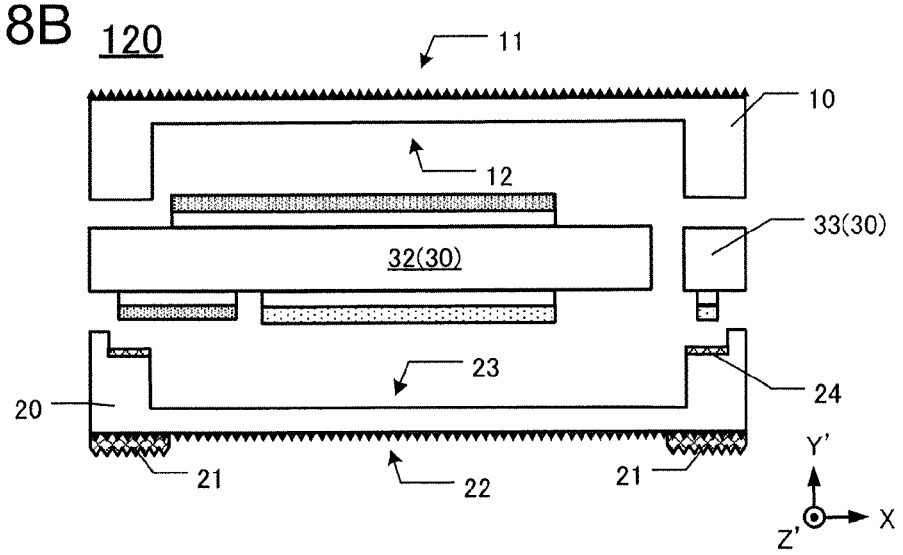
FIG. 8B is a cross-sectional view of a second alternative embodiment of a quartz-crystal oscillator.

FIG. 8B is a cross-sectional view of this embodiment 120 of a quartz-crystal oscillator 120, in which the lid 10 and package base 20 are shown vertically separated from (but still aligned with) the quartz-crystal piece 30. The upper main surface 11 of the lid 10 and the lower main surface 22 of the package base 20 have been roughened. Roughening these surfaces is effective for relaxing stresses. But, the ceiling surface 12 of the lid is not roughened. I.e., surface-roughening is performed only on the Z-side surface (see FIG. 3A) of the lid wafer W10 in a step occurring before Step S101 in FIG. 5. This eliminates Steps S104, S105, and S106 in FIG. 5. Not surface-roughening the floor surface 23 eliminates similar steps in the fabrication of the package base 20.

Second Embodiment of Quartz-Crystal Oscillator

Figure 9A:
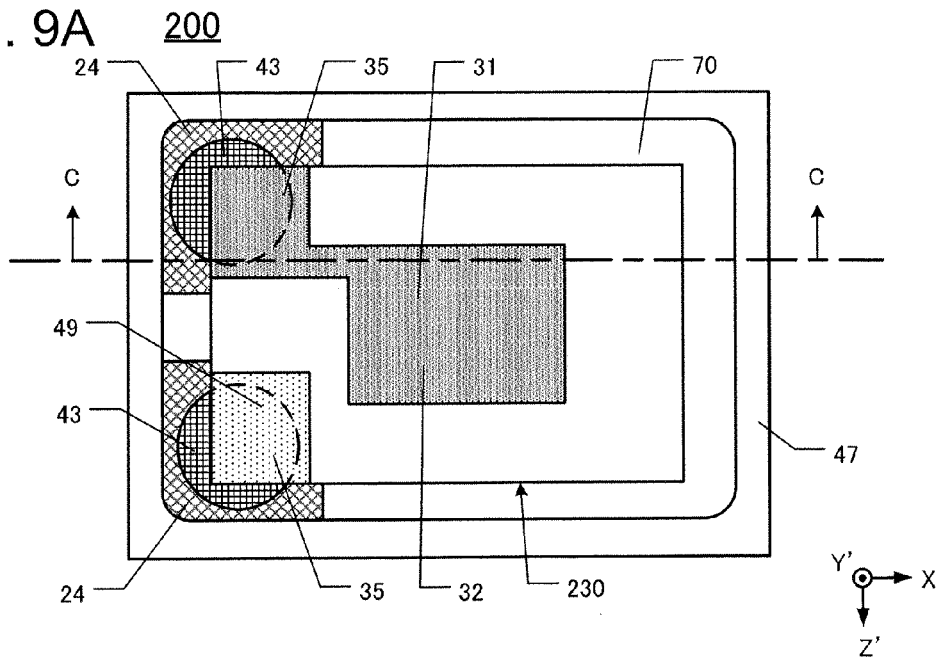
FIG. 9A is a plan view of a second embodiment of a quartz-crystal oscillator, with the lid removed.
Figure 9B:
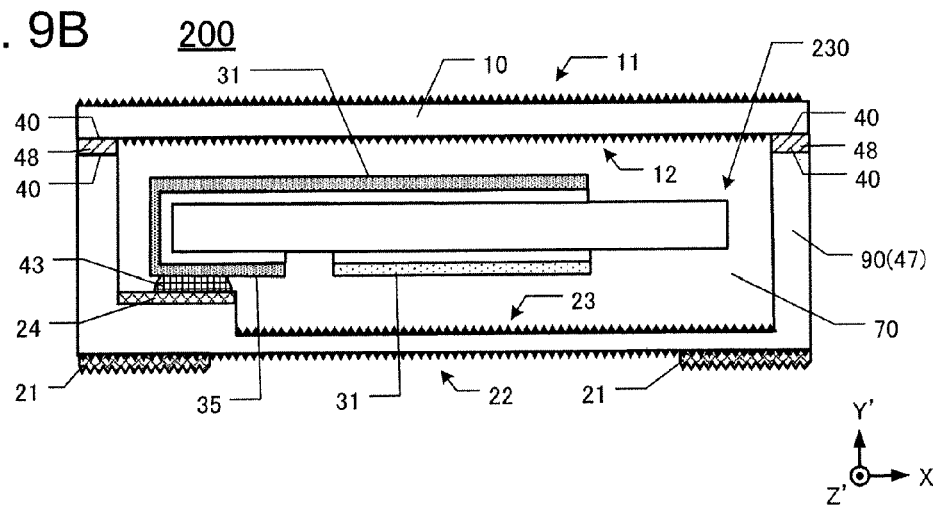
FIG. 9B is a cross-sectional view along the line C-C in FIG. 9A.
Figure 9C:
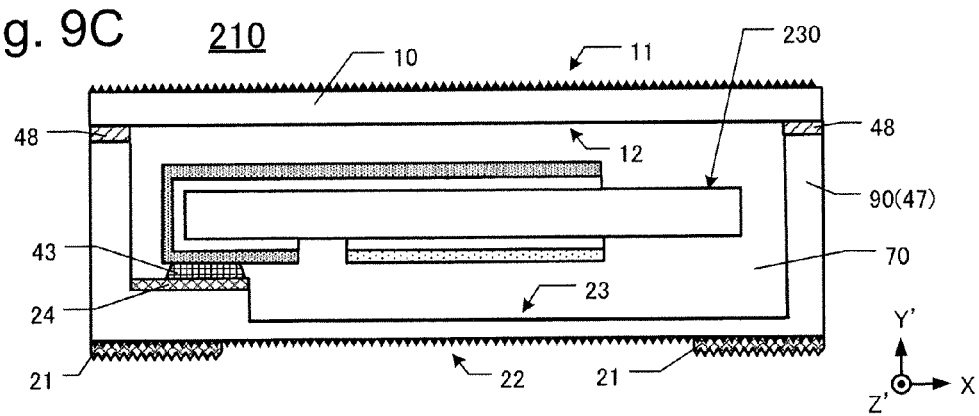
FIG. 9C is a cross-sectional view of a third embodiment of a quartz-crystal oscillator.

Referring to FIGS. 9A-9C, this embodiment of a quartz-crystal oscillator 200 utilizes a quartz-crystal piece 230 lacking a frame member. The following description will be made using the coordinate axes of the AT-cut quartz crystal.

FIG. 9A is a plan view of the quartz-crystal oscillator 200 with the lid 10 removed. The quartz-crystal oscillator 200 comprises a package base 47 configured as a concave box. The quartz-crystal piece 230 extends in a cavity 70 defined by the package base 47. The lid 10 (see FIG. 9B) sealingly covers the package base 47. The quartz-crystal piece 230 is AT-cut quartz crystal having an oscillation frequency of, for example, 4 MHz. The quartz-crystal piece 230, when energized, exhibits thickness-shear vibration in the X-axis direction.

The quartz-crystal piece 230 comprises an excitation portion 32 configured such that respective excitation electrodes 31 are formed in central regions of the front and rear principal planes. The extraction electrodes 35, extending from respective excitation electrodes 31, are situated in a surrounding part 49 that is in the vicinity of the periphery of the quartz-crystal piece 230. By impressing an alternating-current voltage across the excitation electrodes 31, the extraction electrodes 35 and the quartz-crystal piece 230 are caused to exhibit thickness-shear vibration.

The connection electrodes 24 are located in the package base 47, and the connection electrodes 24 are electrically connected to respective external electrodes 21 (see FIG. 9B) located on the lower main surface of the package base 47 via respective conductors (not shown). The quartz-crystal piece 230 is fixed in the cavity 70 by adhering the extraction electrodes 35 to their respective connection electrodes 24 using electrically conductive adhesive 43. In a similar manner the extraction electrodes 35 are electrically connected to the respective conduction electrodes 24. I.e., the excitation electrodes 31 of the quartz-crystal piece 230 are connected to respective external electrodes 21 via respective extraction electrodes 35 and connection electrodes 24.

FIG. 9B is a cross-sectional view along the line C-C of FIG. 9A. The cavity 70 is defined by the floor surface 23 and by a wall 90, both being respective portions of the package base 47. The connection electrodes 24 located in the cavity 70 are connected to respective extraction electrodes 35, which are connected to respective connection electrodes 24. The package base 47 is attached to the lid 10 on the upper surface of the wall 90. Selected regions of the lower main surface 22 (a −Z-side surface) of the package base 47 are surface-roughened. Also surface-roughened are the floor surface 23 (a +Y'-side surface) of the package base 47, the ceiling surface 12 (a −Y'-side surface) of the lid 10, and on the upper main surface 11 (a +Y'-side surface) of the lid. However, the bonding surfaces 40 of the lid 10 and of package base 47 are not surface-roughened.

Exemplary materials of the lid 10 and package base 47 are Z-cut quartz crystal for the lid 10 and glass for the package base 47. If the glass contains metal ions (e.g., a glass such as Pyrex™, borosilicate glass, or soda glass) the lid 10 and package base 47 can be bonded together by anodic bonding, as shown in FIG. 7B. For anodic bonding, first a metal film 48 (comprising, for example, a layer of aluminum or a film formed of a layer of gold on a layer of chromium) is formed on the peripheral region of the −Y'-side surface of the lid 10 by vacuum-evaporation or sputtering. Then, a potential difference is imposed between the metal film 48 and the package base 47 to produce anodic bonding.

FIG. 9C is a cross-sectional view of a quartz-crystal oscillator 210, in which the upper main surface 11 of the lid 10 and the lower main surface 22 of the package base 47 have been surface-roughened. Such processing of only these two surfaces has a beneficial effect with respect to relaxation of stress in the oscillator. In a case in which the package base 47 is made of ceramic and the lid 10 is made of quartz crystal, benefit can be realized even though only the lid 10 is surface-roughened. Hence, in general, surfaces of the lid that can be surface-roughened include only the upper main surface 11, only the ceiling surface 12, or both surfaces.

Third Embodiment of Quartz-Crystal Oscillator

Figure 10A:
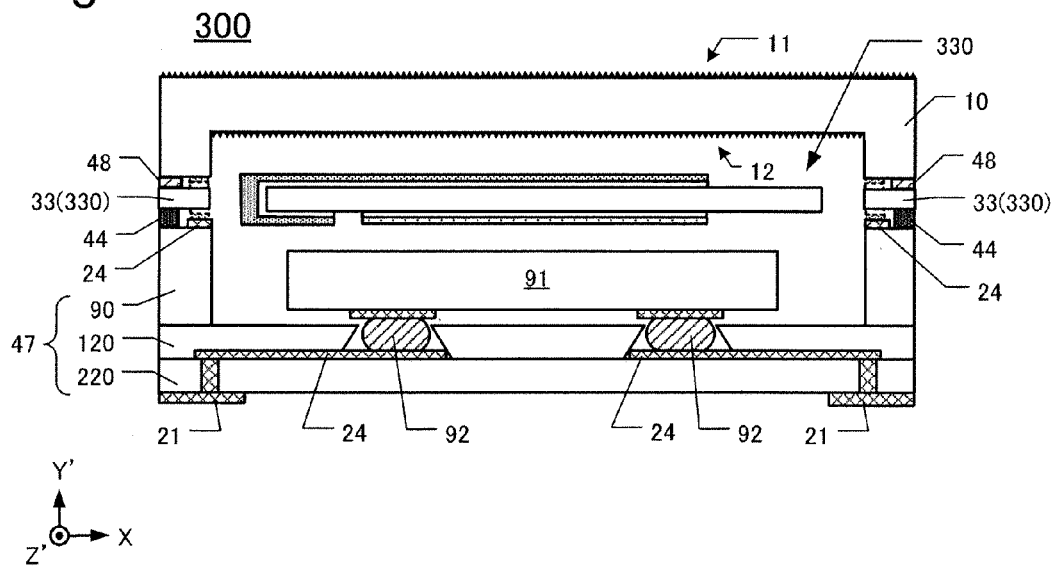
FIG. 10A is a cross-sectional view of a third embodiment of a quartz-crystal oscillator.
Figure 10B:
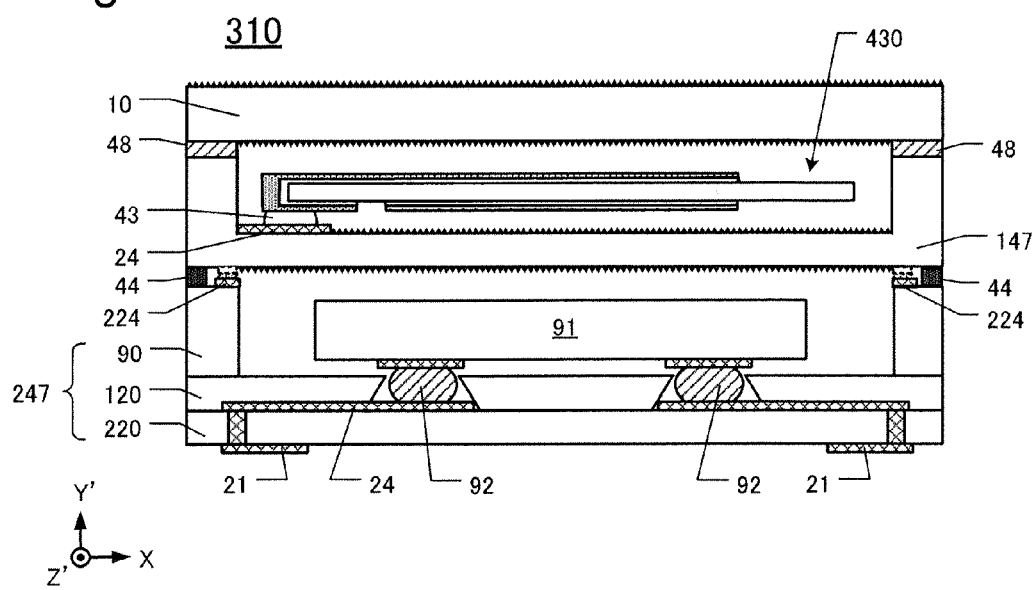
FIG. 10B is a cross-sectional view of a fourth embodiment of a quartz-crystal oscillator.

In FIGS. 10A and 10B, the quartz-crystal oscillator 300 of this embodiment comprises a quartz-crystal device and an integrated circuit. The following description is made using the coordinate axes of the AT-cut quartz crystal. FIG. 10A is a cross-sectional view of the quartz-crystal oscillator 300, which comprises an integrated circuit 91 (including an oscillation circuit), a quartz-crystal piece 330 including the frame member 33, the lid 10, and the package base 47. The package base 47 comprises a wall 90 that provides side surfaces faces of the quartz-crystal oscillator 300, and two base sheets 120 and 220. The quartz-crystal piece 330 is sandwiched between the lid 10 and the package base 47, and the integrated circuit 91 is mounted to the floor surface 23 of the package base 47. The integrated circuit 91 is electrically connected to the quartz-crystal piece via the connection electrodes 24 and bumps 92 situated on the floor surface 23.

The quartz-crystal piece 330 is fabricated of, for example, AT-cut quartz crystal. The lid 10 is fabricated of Z-cut quartz crystal or of glass. The package base 47 is fabricated of ceramic. Connection electrodes 24 extend in the upper part of the wall 90 and are electrically connected to respective extraction electrodes 35 on the frame member 33 of the quartz-crystal piece 330. The frame member 33 and the package base 47 are connected together using a sealant 44. If the lid 10 is made of glass, the lid 10 and frame member 33 alternatively can be bonded together by anodic bonding, as shown in FIG. 7B.

In this embodiment the package base 47 comprises two base sheets 120, 220 that are laminated together for strength reinforcement. However, there is a possibility that the lid 10 may not resist stresses produced by thermal contraction of the quartz-crystal piece 330. This stress imposed on the lid 10 can be relaxed by surface-roughening one or both the upper main surface 11 and the ceiling surface 12 of the lid 10.

FIG. 10B is a cross-sectional view of an alternative configuration of the quartz-crystal oscillator 310, which comprises a quartz-crystal piece 430, the lid 10, a first package base 147, a second package base 247, and the integrated circuit 91. The quartz-crystal piece 430 is mounted to the first package base 147, and the integrated circuit 91 is mounted to the second package base 247.

The quartz-crystal piece 430 of this embodiment is made of AT-cut quartz crystal, for example. The lid 10 is made of Z-cut quartz crystal, the first package base 147 is made of glass, and the second package base 247 is made of ceramic, for example. The upper main surface 11 and ceiling surface 12 of the lid 10, and the floor surface 23 and lower main surface 22 of the first package base 147 are surface-roughened. The lid 10 and the first package base 147 can be bonded by anodic bonding, such as shown in FIG. 9. The first package base 147 and the second package base 247 can be adhered together using a sealant 44.

The quartz-crystal piece 430 is affixed to the connection electrodes 24, located in the first package base 147, using electrically conductive adhesive 43, which also provides electrical connections. The connection electrodes 24 are connected to respective second connection electrodes 224 on the wall 90 of the second package base 247. The second connection electrodes 224 are connected to the integrated circuit 91, which controls operation of the quartz-crystal piece 430. The integrated circuit 91 is connected to the external electrodes 21.

In this oscillator 310, by surface-roughening the lid 10 and the first package base 147 (made of quartz crystal or glass), thermal and other stresses that otherwise would concentrate on the lid 10 and first package base 147 are reduced, which reduces the fraction of defective product in an assembly plant.

Fourth Embodiment of Quartz-Crystal Oscillator

Figure 11A:
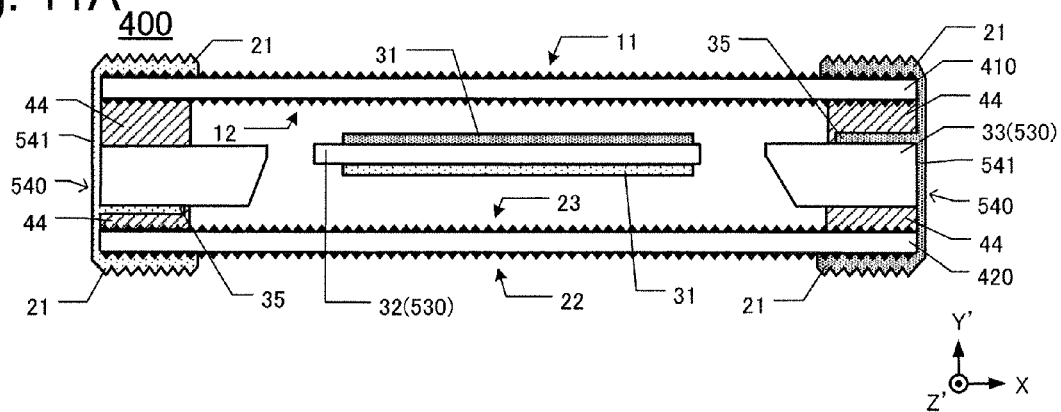
FIG. 11A is a cross-sectional view of a fifth embodiment of a quartz-crystal oscillator.
Figure 11B:
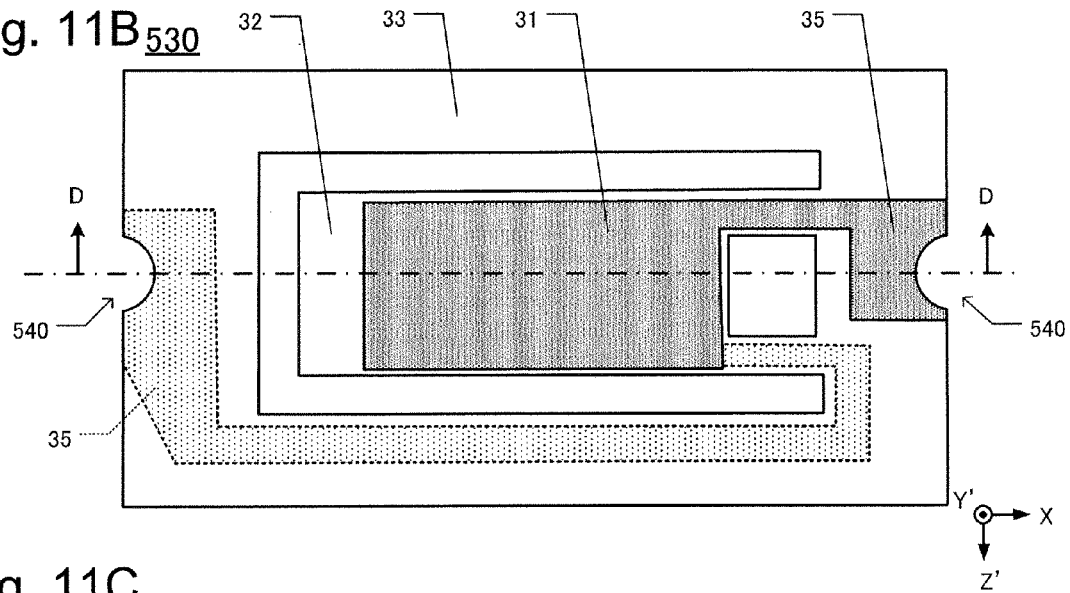
FIG. 11B is a plan view of the quartz-crystal piece used in the fifth embodiment.
Figure 11C:
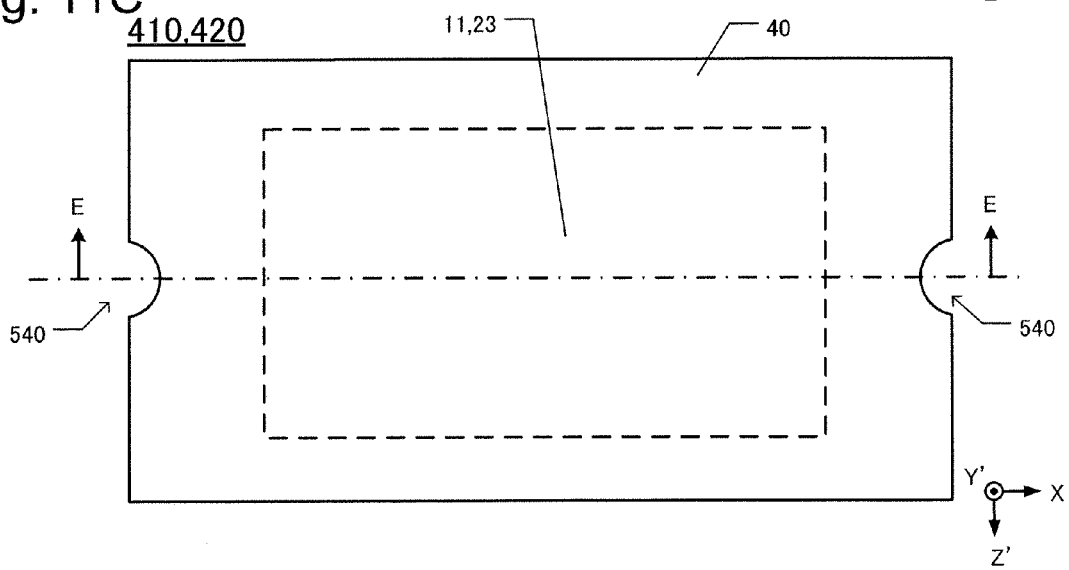
FIG. 11C is a plan view of an exemplary lid and an exemplary package base 420.

Referring to FIGS. 11A-11C, the quartz-crystal oscillator 400 of this embodiment is comprises a quartz-crystal piece 530. The description is provided below using the coordinate axes of the AT-cut quartz crystal. FIG. 11A is a cross-sectional view of the quartz-crystal oscillator 400, which comprises a lid 410, a package base 420, and the quartz-crystal piece 530. The cross-section shown in FIG. 11A is along the line D-D in FIG. 11B and along the line E-E line in FIG. 11C, showing the quartz-crystal piece 530, the lid 410, and the package base 420. The quartz-crystal piece 530 is sandwiched between the lid 410 and package base 420. Respective peripheral bonding surfaces 40 on the lid 410 and package base 420 are bonded to the frame member 33 using a polyimide sealant, sealing glass, or the like. The upper main surface 11 and ceiling surface 12 of the lid 410 and the lower main surface 22 and floor surface 23 of the package base 420 are surface-roughened compared to the surfaces of the excitation portion 32. Respective excitation electrodes 31 are formed on the upper and lower surfaces of the excitation portion 32, and the excitation electrodes 31 are connected to respective extraction electrodes 35 on the frame member 33. Respective pairs of external electrodes 21 are formed on the lid 410 and on the package base 420. A respective castellation 540 is formed on each short side (+X-side and −X-side) of the quartz-crystal piece 530, lid 410, and package base 420. The extraction electrodes 35 are connected to respective external electrodes 21 via respective castellation electrodes 541.

FIG. 11B is a plan view of the quartz-crystal piece 530, in which respective excitation electrodes 31 are formed in middle regions of the upper and lower surfaces of the excitation portion 32, wherein the upper and lower surfaces are in the upper and lower, respectively principal planes of the excitation portion 32. The frame member 33 surrounds the excitation portion 32. Respective castellations 540 are formed on the +X-side and on the −X-side of the frame member 33. Respective extraction electrodes 35 are situated on the frame member 33 for the following electrical paths: (a) from the excitation electrode 31 on the +Y'-face of the excitation portion 32 to the castellation 540 on the +X-face, and (b) from the excitation electrode 31 on the −Y'-face of the excitation portion 32 to the castellation 540 on the −X-face.

FIG. 11C is a plan view of the lid 410 and the package base 420. The castellations 540 are situated on the +X-side of the lid 410 and package base 420 and on the −X-side thereof. The lid 410 and package base 420 are cut from a unit of synthetic quartz crystal 50 that was lumbered at a predetermined angle and to a predetermined thickness, but not lapped or polished afterward. I.e., the lid 410 and package base 420 are formed with planes as cut from the unit of synthetic quartz crystal 50 that was lumbered at a predetermined angle and to a predetermined thickness. Peripheral parts of the lid 410 and package base 420 existing outside the region denoted by dashed line in FIG. 11C serve as bonding surfaces 40, and are bonded to the frame member 33 of the quartz-crystal piece 530 using the sealant 44. Normally, both principal planes of the lid and package base are lapped using a coarser-grained polishing material than used for polishing. The coarse-polished planes are normally then polished using a specified finer grit to reduce their surface-roughness from that produced by lapping. However, in this embodiment both principal planes of the lid 410 and package base 420 are neither lapped nor polished. Consequently, their respective surfaces are rougher than the surface-roughness of the excitation portions 32 of the quartz-crystal piece 530 (which have been lapped and polished). The external electrodes 21 on the lid 410 and package base 420 can be formed by vacuum-evaporation or sputtering, using a mask (not shown).

After bonding the quartz-crystal piece 530, lid 410, and package base 420 to one another, a metal film is formed in the castellations 540 to form respective castellation electrodes 541. The external electrodes 21 on the lid 410 and package base 420 may be formed simultaneously with formation of the castellation electrodes 541, and may be formed on the lid 410 and package base 420 before the lid 410 and package base 420 are bonded to the quartz-crystal piece 530.

In this quartz-crystal oscillator 400 the principal planes of the lid 410 and package base 420 are comparatively rough, but not due to lapping and polishing. Hence, it is unnecessary to perform any special roughening of these surfaces. Also, the lid 410 and package base 420 can be formed having similar respective shapes, allowing manufacturing processes for lids 410 and package bases 420 to be shared, and allowing simplification of the method for manufacturing the quartz-crystal oscillator 400.

Although the quartz-crystal oscillator 400 can be manufactured while both principal planes of the lid 410 and package base 420 remain as comparatively rough surfaces, it is also possible to have only one principal plane be rough while the other principal plane has a mirror finish. Stress concentrations also can be reduced by only lapping the subject surfaces, without any subsequent polishing. Stresses also can be reduced if both principal planes have been lapped but not polished.

Since the quartz-crystal oscillator comprises multiple parts, the different respective coefficients of thermal expansion of those parts may cause a strongly stressed or weak part to fracture, which increased the percentage of defective product. By relieving these stresses to prevent such breakage by roughening selected surfaces of the parts, the fraction defective in the manufacturing process is reduced. In the case in which AT-cut quartz crystal is used for the lid 410 and package base 420 (i.e., neither being made of glass or Z-cut quartz crystal), surface-roughening effectively reduces thermal fracture of product even if AT-cut quartz crystal is used for making the quartz-crystal piece, the package base, and the lid of the quartz-crystal oscillator (which provides all three of these parts with equal coefficients of thermal expansion), the quartz-crystal oscillator may still encounter local heating during soldering, etc., wherein thermal stress may arise between a location being locally heated and a location that is not heated.

Fifth Embodiment of Quartz-Crystal Oscillator

The quartz-crystal oscillator 400 of this embodiment is constructed without lapping or polishing either the lid 410 or package base 420. If neither lapping nor polishing is performed, irregular reflections may occur during exposures necessary for electrode formation. The irregular reflections arise from the surficial unevenness of the wafer surface being exposed, which may increase the difficulty of forming the electrodes on the wafer. To address this issue, wet-etching may be performed to eliminate the surficial unevenness sufficiently to eliminate irregular reflections. An embodiment of a method for manufacturing a quartz-crystal oscillator 500 is described below, wherein the method includes cutting a wafer from a unit of synthetic quartz crystal 50 that was lumbered at a predetermined angle and to a predetermined thickness and including wet-etching of the wafer.

Figure 12:
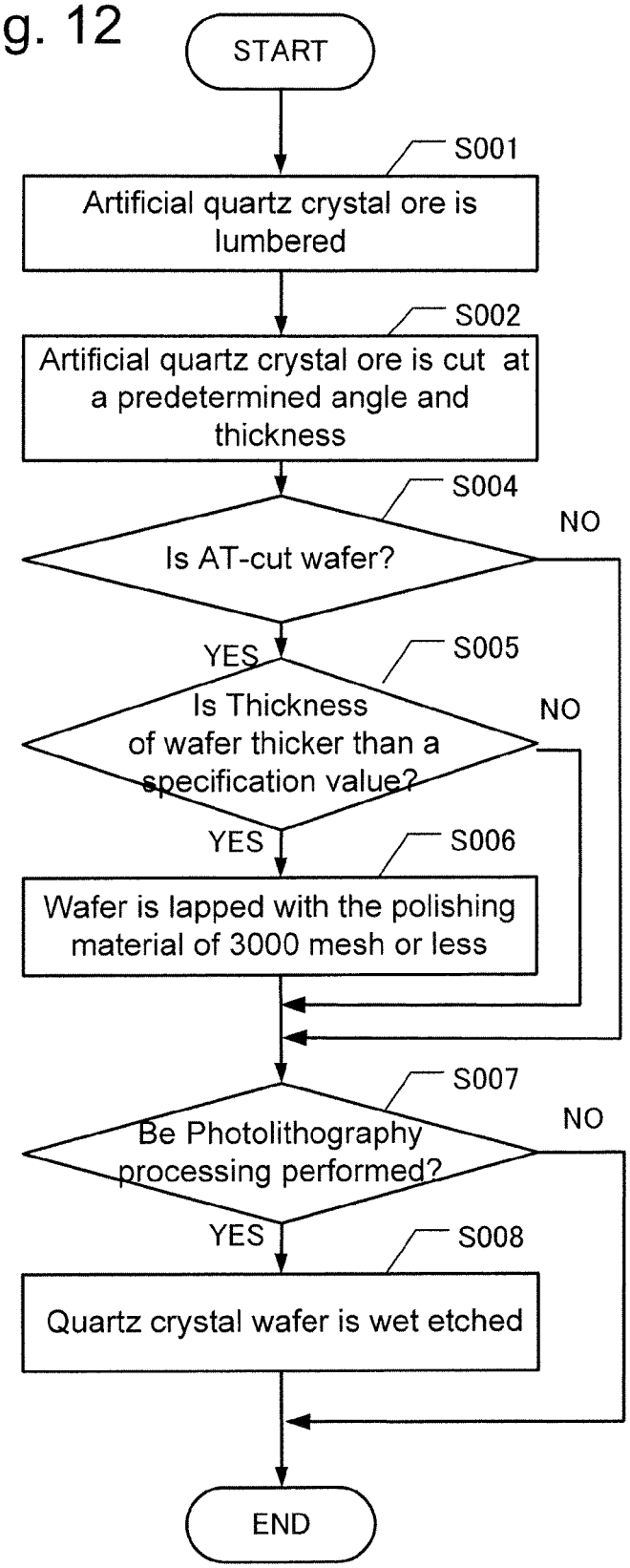
FIG. 12 is a flow-chart of steps in an exemplary method for lapping and etching the quartz-crystal lid wafer.

Exemplary Method for Manufacturing Quartz-Crystal Oscillator of Fifth Embodiment FIG. 12 is a flow-chart of a method embodiment including the lapping and wet-etching steps performed on a quartz-crystal lid wafer W10. Although FIG. 12 is directed to a method applied to the lid wafer W10, it will be understood that a quartz-crystal base wafer W20 can be manufactured by the same process.

In Step S001 the unit of synthetic quartz crystal 50 is lumbered. In Step S002 the quartz-crystal lid wafer W10 is cut from the unit of synthetic quartz crystal 50 that was lumbered at a predetermined angle and to a predetermined thickness. Since Steps S001 and S002 are the same as corresponding steps shown in FIG. 4A, their explanations are omitted here. In FIG. 12, after Step S002, Step S004 is performed, thereby skipping Step S003.

In Step S004 a determination is made of whether the lid wafer W10 is made of AT-cut crystal. If so, then the process proceeds to Step S005; if not, then the process proceeds to Step S007. The reason for making these determinations is that the progress of wet-etching varies with cut angle. Table 1, below, lists the respective etching tendencies of AT-cut wafer and Z-cut wafer.

TABLE 1

|  | Etching Quantities ($\mu m$) | Ra ($\mu m$) |
|---|---|---|
| AT-cut wafer without lapping processing | 0 | 2.24 |
|  | 5 | 4.31 |
|  | 10 | 3.24 |
|  | 35 | 0.41 |
| AT-cut wafer with the lapping processing | 0 | 1.74 |
|  | 5 | 2.63 |
|  | 10 | 1.98 |
|  | 20 | 0.43 |
| Z-cut wafer without lapping processing | 0 | 1.49 |
|  | 5 | 2.81 |
|  | 10 | 2.42 |
|  | 20 | 1.95 |

Table 1 shows respective amounts of etched material produced by the AT-cut wafer and the Z-cut wafer and average values (Ra) of surface-roughness. The table lists etching quantities ($\mu m$) and average values Ra ($\mu m$) of the surface-roughness in the cases in which the following wafers were wet-etched: the AT-cut wafer after being cut from the unit of synthetic quartz crystal 50; the AT-cut wafer that has been cut and lapped; and the Z-cut wafer after cutting. In the AT-cut wafer after cutting, the average values Ra are as follows: 2.24 $\mu m$ when no etching is performed; 4.31 $\mu m$ upon etching to a depth of 5 $\mu m$; 3.24 $\mu m$ upon etching to a depth of 10 $\mu m$; and 0.41 $\mu m$ upon etching to a depth of 35 $\mu m$. For an AT-cut quartz-crystal wafer that was lapped using a 3000-mesh polishing material after cutting, the average values Ra were as follows: 1.74 $\mu m$ with no etching; 2.63 $\mu m$ upon etching to a depth of 5 $\mu m$; 1.98 $\mu m$ upon etching to a depth of 10 $\mu m$; and 0.43 $\mu m$ upon etching to a depth of 20 $\mu m$. In the Z-cut wafer after cutting, the average values Ra are as follows: 1.49 $\mu m$ when no etching is performed; 2.81 $\mu m$ upon etching to a depth of 5 $\mu m$; 2.42 $\mu m$ upon etching to a depth of 10 $\mu m$; and 1.95 $\mu m$ upon etching to a depth of 20 $\mu m$.

Table 1 shows, for all three wafers, that etching to a depth of only 5 $\mu m$ produced the greatest Ra values, and deeper etching produced lower Ra values. If a Z-cut wafer is etched deeper after Ra is maximized by etching initially only to 5 $\mu m$, the Ra value will approach the value of Ra extant before commencing etching. In comparison, in an AT-cut wafer, the deeper the etching, the lower the Ra value of surface-roughness becomes, which tends to flatten the wafer surface. Table 1 also shows that, even with a lapped AT-cut wafer, it is possible to achieve a surface-roughness of more than or equal to the wafer's Ra after cutting by etching to a maximum depth of 10 $\mu m$.

Returning to FIG. 12, in Step S005 a determination is made of whether the thickness of the AT-cut wafer is greater than a specified thickness. If the wafer is thicker than specified, the process proceeds to Step S006; if the thickness is as specified, then the process proceeds to Step S007. If the thickness is less than specified, the wafer is deemed non-conforming. During the initial cutting of the wafer from the unit of synthetic quartz, the wafer is cut thicker than its specification thickness to avoid producing nonconforming product. Hence, it is rare when the thickness is less than specified. Consequently, the flow-chart of FIG. 12 does not address a case in which the wafer thickness is less than specified. By way of example, the specified thickness of the AT-cut wafer in Step S005 is about 10 μm greater than the target thickness at completion of the process. Continuing with the example, if the wafer thickness at time of product completion is 50 μm and wet-etching is performed on a single surface to a depth of 5 μm in a later step, the specified thickness of the wafer in Step S005 is 60 μm.

In Step S006 the AT-cut wafer is lapped using an abrasive of 3000-mesh or less. In this step the thickness of the wafer is adjusted to the value specified in Step S005 by lapping selected surfaces of the wafer. The lapping abrasive denoted by lower mesh values is coarser than abrasives having larger mesh values. Hence, if the abrasive actually used is a lower mesh size, then the surface-roughness Ra achieved using the abrasive will be correspondingly greater. The stated grit sized of 3000-mesh or less used in Step S006 effectively produces a desired surface-roughness of the wafer. Although wafer-thickness adjustments of a Z-cut wafer may be made by lapping, since the surface-roughness of the wafer after cutting becomes less than of an AT-cut wafer (see Table 1) and since lapping reduces surface-roughness even more, lapping may be omitted.

In Step S007, a determination is made as to whether photolithography is to be performed on the wafer. If the answer is "yes," the wafer proceeds to Step S008. If the answer is "no," the process terminates and the wafer will then be used as the quartz-crystal lid wafer W10.

Regarding lids, there is a case in which photolithography need not be performed by vacuum-evaporating or sputtering a metal film and using a mask to form electrodes such as the external electrodes 21 of the lid 410 shown in FIG. 11A, for example. Wet-etching is performed in the fifth embodiment to make the photolithography for electrode formation easy to perform. Therefore, it is unnecessary to perform wet-etching on a wafer on which photolithography will not be performed, allowing Step S008 to be skipped.

In Step S008 the quartz-crystal lid wafer W10 is wet-etched. Since quartz crystal is hard, cutting the lid wafer W10 from the unit of synthetic quartz crystal 50 provides the lid wafer W10 with a surface having a roughness of 1000 mesh or less. In this state, the quartz-crystal lid wafer W10 is wet-etched. Wet-etching completes the lid wafer W10 while its surface is in a rough state; such a wafer is suitable for exposure.

In the flow-chart of FIG. 12, although Step S007 provides a step in which a determination is made of whether to perform photolithography on the wafer, this step S007 may be omitted. This is because, even when electrodes are not formed on the lid and photolithography is not performed, wet-etching nevertheless may be performed. An advantage of not providing Step S007 is: since electrodes are formed on the package base (requiring that photolithography be performed), it may be unnecessary to divide the respective wafer-manufacturing processes for the package base and the lid.

Figure 13A:
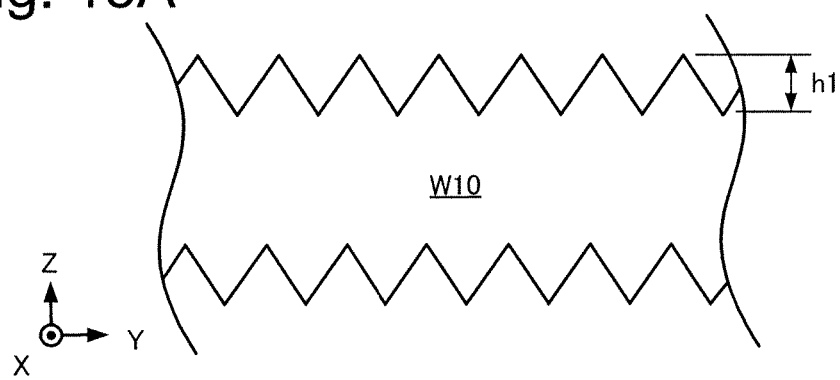
FIG. 13A is an outline cross-sectional view of the quartz-crystal lid wafer that has been cut from a unit of synthetic quartz crystal that was lumbered, before wet-etching the wafer.

FIG. 13A is schematic cross-sectional view of a quartz-crystal lid wafer W10, before wet-etching, as cut from a lumbered unit of synthetic quartz crystal 50. Before wet-etching, the surface of the quartz-crystal lid wafer W10 has a surficial unevenness corresponding to a roughness achievable using an abrasive of 1000 mesh or less. Hence, the average height h1 of surficial unevenness features before wet-etching is, for example, no less than 25.4 μm. Immediately after cutting, the surficial unevenness features are sharp overall, as indicated in FIG. 13A. Such a wafer surface can produce irregular reflections if photolithographic exposures are being made on the surface, which makes it difficult to form an exposure pattern on the surface.

Figure 13B:
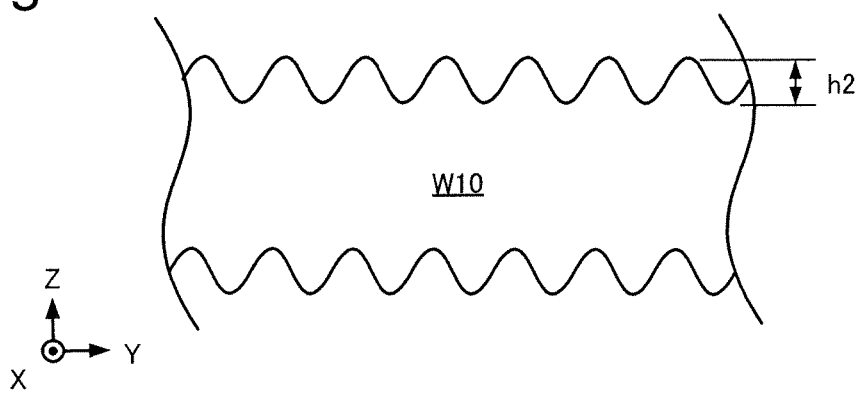
FIG. 13B is a cross-sectional view of the quartz-crystal lid wafer after wet-etching.

FIG. 13B is a cross-sectional view of the quartz-crystal lid wafer W10 after wet-etching it. As shown in Table 1, if the Z-cut wafer is etched 20 μm deep, the average height h2 of the unevenness features on the surface is nearly equal to h1. Even when the AT-cut wafer is lapped (Step S006), it is possible to adjust h2 to a value close to h1 by etching to a depth of about 10 μm or less. Moreover, after cutting the AT-cut wafer, it is possible to adjust h2 to be nearly equal to h1 by adjusting the etching depth to 10 μm or less. The height h2 is adjusted to be close to the height h1, not less than h1. But, since the wafer surface in FIG. 13B includes more generally rounded unevenness features, it is easier to form exposure patterns on it. During 20-μm etchings into the Z-cut quartz wafer, we confirmed that exposures for electrode formation, etc., were possible.

Figure 14A:
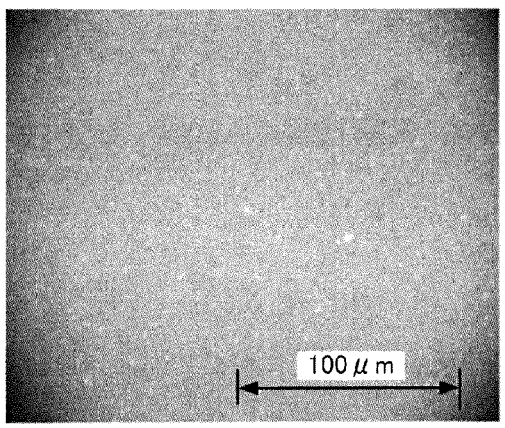
FIG. 14A is a photograph of a wafer surface before wet-etching it.

FIG. 14A is a photograph of a wafer surface before wet-etching. The wafer was cut from a unit of lumbered synthetic quartz crystal. The unevenness of the wafer surface before wet-etching does not depend on the cutting direction of the wafer, and the surface state is uniform, as shown in FIG. 13A.

Figure 14B:
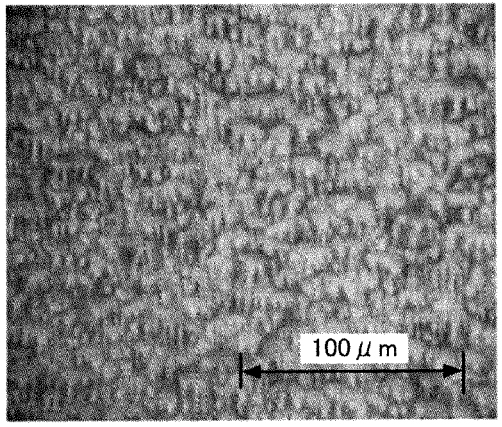
FIG. 14B is a photograph of a surface of an AT-cut wafer after wet-etching.

FIG. 14B is a photograph of a wafer surface (AT-cut wafer) after wet-etching. The scale of the image shown in FIG. 14B is the same as the scale of the image in FIG. 14A. Wet-etching was performed to etch the wafer surface to a depth of 20 μm. In FIG. 14B, the surface of the AT-cut wafer was etched according to its crystal structure, wherein an original pattern appears on the AT-cut wafer.

Figure 14C:
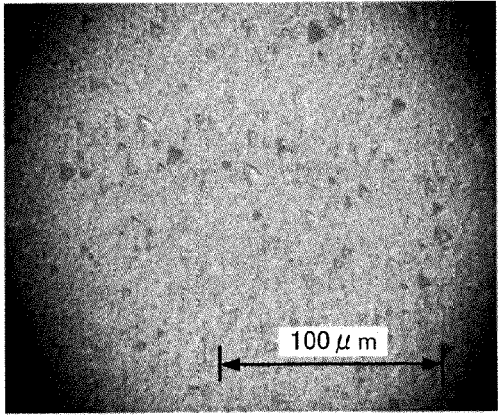
FIG. 14C is a photograph of a surface of a Z-cut wafer after wet-etching.

FIG. 14C is a photograph of a surface of a Z-cut wafer after wet-etching. The scale of the image shown in FIG. 14C is equal to the scale of the image in FIG. 14A. Wet-etching was performed to etch the wafer surface to a depth of 20 μm. In FIG. 14C, the surface of the Z-cut wafer was etched according to the crystal structure, wherein an original pattern appears on the Z-cut wafer.

Although the same wet-etching was performed in FIGS. 14B and 14C, the wafer surfaces were etched according to their respective crystal structures. Hence, different patterns appear on each respective surface. Since surficial unevennesses corresponding to respective differences in height of surficial microfeatures on the wafer surface can be adjusted by the adjusting the etching depth as shown in Table 1, even if the wafer is cut to a particular plane, the roughened surface can be formed by wet-etching.

In the quartz-crystal oscillator 500, if respective Z-cut wafers are used for the lid and package base it is desirable that wet-etching be performed. Although wet-etching can be performed to a depth of 20 μm, it is desirable that the etching depth be less than 20 μm. This is because, as etching depth decreases, the quantity of wafers obtainable from a single unit of synthetic quartz crystal 50 is correspondingly greater. This shortens wet-etching time, and hence the time required to manufacture the lid and package wafers. When considering range of etching depth in which the wafer can be easily exposed and the like, it is desirable that the etching depth be in the range of 1 to 20 μm.

By not polishing the base wafer and the lid wafer, and by not lapping or polishing the quartz-crystal oscillator 500, it is possible to reduce manufacturing time and costs considerably. Microlithographic exposures of the wafer surfaces can be performed easily by wet-etching the surfaces beforehand. Since the wafer is not mirror-finished, it can be manufactured at low cost. In the quartz-crystal oscillator 500, since surficial unevenness remains on the surfaces of the external electrodes 21, the ability of solder to adhere to them is enhanced by the anchor effect. However, in the quartz-crystal oscillator 500, since the bonding surfaces 40 are roughened, it can be difficult to directly bond the quartz-crystal materials by siloxane bonding. Hence, it is desirable that wafer bonding be performed using a sealant comprising a material capable of conforming thickness-wise to variations in surficial unevenness of the bonding surfaces. The quartz-crystal oscillator 500 can be shaped similarly to the quartz-crystal oscillator 100 by forming respective recesses in the quartz-crystal material of the lid and package base.

Sixth Embodiment of Quartz-Crystal Oscillator

There are instances in which manufacture of the quartz-crystal oscillator can be simplified by imparting respective different degrees of surficial unevenness to the surfaces of the quartz-crystal piece, the lid, and the package base. In other words, it is possible to provide different respective surface-roughness to one or more of these surfaces. This embodiment is directed to such an oscillator.

Figure 15A:
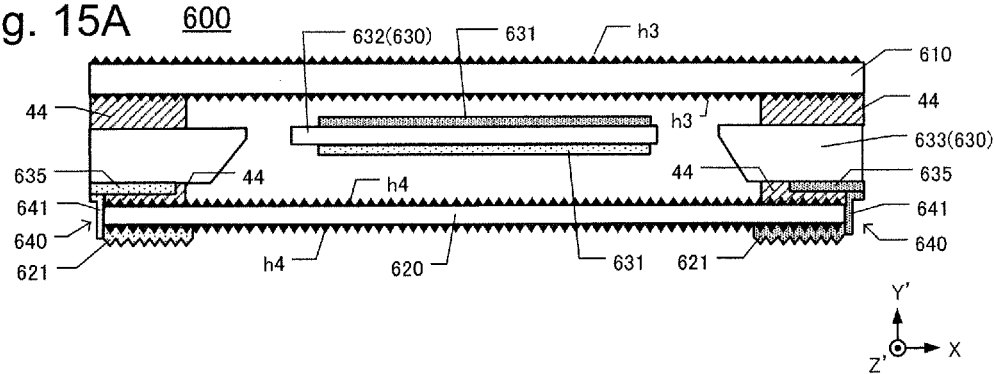
FIG. 15A is a cross-sectional view of a sixth embodiment of a quartz-crystal oscillator.

FIG. 15A is a cross-sectional view of this embodiment of a quartz-crystal oscillator 600. FIG. 15A is a cross-sectional view along the line F-F in FIG. 15B and in FIG. 15C. The quartz-crystal oscillator 600 comprises a quartz-crystal piece 630, a lid 610, and a package base 620. The quartz-crystal piece 630, lid 610, and package base 620 are each made from AT-cut quartz crystal. The quartz-crystal piece 630, lid 610, and package base 620 are bonded together using a sealant 44, respectively, such as low-melting-point glass.

The quartz-crystal piece 630 comprises an excitation portion 632 and a frame member 633 surrounding the excitation portion 632. Respective excitation electrodes 631 are situated on the upper and lower surfaces of the excitation portion 632, and extraction electrodes 635 are formed on the −Y'-face of the frame member 633. The extraction electrode 635 extends as far as the +X-end of the frame member 633, and is electrically connected to a respective excitation electrode 631 formed on the +Y'-face of the excitation portion 632. Another extraction electrode 635 extends as far as the −X-end of the frame member 633, and is electrically connected to a respective excitation electrode 631 formed on the −Y'-face of the excitation portion 632. The surface-roughness of the excitation portion 632 in regions in which the excitation electrodes 631 are formed affects the vibration characteristics of the excitation portion 632. The lower the degree of surface-roughness of the excitation portion 632, the better the oscillation characteristics. Hence, that surface desirably is polished to a mirror finish.

The lid 610 is planar, and is placed on the +Y'-side of the quartz-crystal piece 630. This placement of the lid 610 is performed at the wafer level, after the lid wafer has been cut from the unit of synthetic quartz crystal (Step S002 in FIG. 4A). The lid wafer is bonded to the wafer on which the quartz-crystal pieces 630 are formed. Therefore, the surfaces of the lid 610 have a surface-roughness comparable to the surface-roughness obtained when the quartz material has been lapped with a polishing material of 1000 mesh. For fabricating the lid 610, AT-cut quartz crystal is used, in the form of a wafer as cut from the unit of synthetic quartz. The vertical difference of surficial unevenness of the upper and lower main surfaces of the lid 610 is denoted h3, wherein h3=2.24 µm from Table 1. The lid 610 desirably has a thickness between 100 µm to 140 µm, for example.

The package base 620 is also planar, and is placed on the −Y'-side of the quartz-crystal piece 630. A pair of external electrodes 621 are formed on the −Y'-face of the package base 620. A respective castellation 640 is formed on each edge of the package base 620 facing in the +X-axis direction in the −X-axis direction. After bonding the package base 620 to the quartz-crystal piece 630, the external electrodes 621 and respective extraction electrodes 635 are electrically connected by forming a metal film 641 in each castellation 640 by vacuum-evaporation, sputtering, or the like. The base 620 desirably has a thickness between 80 µm and 120 µm.

The external electrodes 621 are formed on the package base 620 by a process including photolithography. Therefore, it is desirable that the upper main surface of the package base 620 be wet-etched, as described in the fifth embodiment. To adjust the height of the entire quartz-crystal oscillator 600, the thickness of the package base 620 can be established as required by lapping. I.e., the package base 620 is adjusted in thickness by being cut at 1000 mesh in Step S002 of FIG. 12, then lapped at 2000 mesh in Step S006, then wet-etched to a depth of about 5 µm in Step S008. It is expected that the Ra value after lapping at 2000 mesh have a median value, after cutting from AT-cut crystal, as set forth in Table 1. After lapping the AT-cut material (etching depth of 0 µm), the expected Ra value is about 2 µm.

In the case in which etching to a depth of 5 µm is performed, after the AT-cut crystal is cut (Table 1), the Ra value is increased by about 2 µm. After the AT-cut unit is lapped, Ra increases by about 1 µm. Hence, it is expected that lapping at 2000 mesh increases the Ra value by about 1.5 µm. That is, it is expected that h4 becomes about 3.5 µm. Lapping with a 2000 mesh abrasive is desirable, especially considering the time required to perform lapping and the ease with which the thickness of the package base 620 can be accurately adjusted.

Figure 15B:
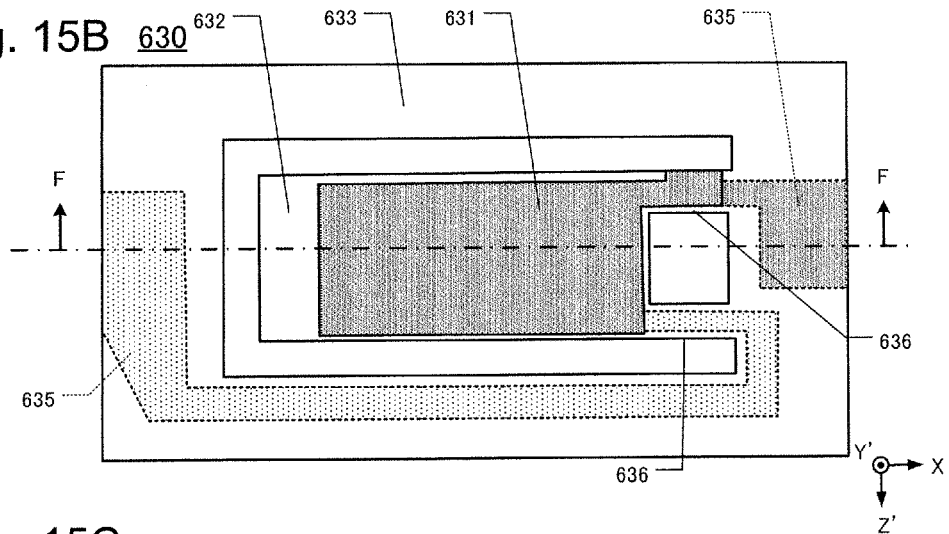
FIG. 15B is a plan view of the quartz-crystal piece used in the sixth embodiment.

FIG. 15B is a plan view of the quartz-crystal piece 630. The quartz-crystal piece 630 comprises the excitation portion 632 and the frame member 633 surrounding the excitation portion 632. The excitation portion 632 and the frame member 633 are connected together by a pair of linkages 636. The excitation electrode 631 on the +Y'-face of the excitation portion 632 is connected from the +Y'-side to the −Y'-side via one of the linkages 636 to the respective extraction electrode 635 located as far as the +X-end of the frame member 633. The excitation electrode 631 on the −Y'-face of the excitation portion 632 is connected via the other linkage 636 to the respective extraction electrode 635 located as far as the −X-end of the frame member 633.

Figure 15C:
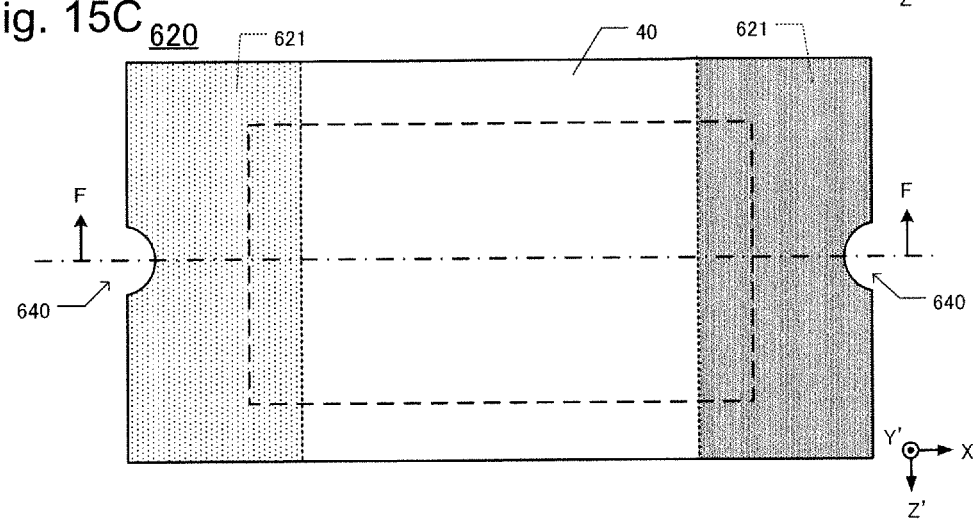
FIG. 15C is a plan view of the package base used in the sixth embodiment.

FIG. 15C is a plan view of the package base 620. A pair of external electrodes 621 are disposed on the −Y'-face of the package base 620. A respective castellation 640 is formed on the +X-facing edge of the package and on the −X-facing edge of the package base 620. The +Y'-face of the package base 620 is bonded to the frame member 633 at the bonding surface 40 located outside the frame, as denoted by dashed lines in FIG. 15C.

During manufacture of the quartz-crystal oscillator 600, excess lapping, polishing, etc., are not performed on the lid 610 and the package base 620. This enables the entire process to be simplified, which reduces production costs. Since the quartz-crystal piece 630, lid 610, and package base 620 are processed to have respective surface-roughnesses suitable for these respective parts, the surface-roughnesses of the quartz-crystal piece 630, lid 610, and package base 620, respectively, differ from each other.

Wet-etching to a depth of about 5 µm, similar to the depth of etching of the package base 620, may be performed on the lid 610. Thus, h3 becomes 4.31 µm from Table 1, and the surface-roughness of the lid 610 becomes greater than the surface-roughness of the package base 620. When wet-etching the lid 610, production costs can be reduced by etching to a depth comparable to the etching depth achieved on the package base 620 and by achieving commonality of the etching steps performed on the package base 620 and on the lid 61.

As mentioned above, although optimal embodiments of the present invention were explained in detail, it will be understood by a person skilled in the art that the invention encompasses various alterations and modifications to the embodiments, within the technical scope of the invention. For example, in the sixth embodiment, although the quartz-crystal piece was AT-cut quartz crystal, BT-cut quartz crystal (which vibrates in the thickness-shear mode) could have been used instead.

The present invention is applicable not only to quartz-crystal pieces that vibrate in the thickness-shear mode but also to tuning-fork type quartz-crystal vibrating pieces formed from Z-cut quartz crystal. An exemplary tuning-fork type quartz-crystal vibrating piece comprises a rectangular base and a pair of vibrating arms extending from one edge of the base. It also has a frame member that surrounds the tuning-fork type quartz-crystal vibrating piece. The frame member is bonded to the lid 10 and to the package base 20 (see FIG. 1) made of glass. Thus, the present invention is also applicable to the tuning-fork type quartz-crystal vibrating pieces.

What is claimed is:

1. A quartz-crystal device, comprising:
    a quartz-crystal piece comprising an excitation portion that vibrates whenever a voltage is impressed across the excitation portion, the vibration portion having a designated surface roughness;
    a package base fabricated of glass or quartz crystal having a crystal-lattice orientation, the package base having an inner main surface and an opposing outer main surface, the quartz crystal piece being mounted on the inner main surface; and
    a lid fabricated of glass or quartz crystal having a crystal-lattice orientation, the lid having an inner main surface and an outer main surface, the lid forming a package in which the quartz-crystal piece is sealed;
    wherein the package base and lid are made of either different respective materials or of the same material having different respective crystal-lattice orientations;
    wherein the inner main surface of the package base and inner main surface of the lid comprise respective bonding surfaces, the bonding surfaces having designated respective surface-roughnesses; and
    wherein respective main surface regions of the package base and lid, except for the respective bonding surfaces, have respective designated surface-roughnesses that are greater than the surface roughnesses of the bonding surfaces and greater than the surface-roughness of the excitation portion.

2. The quartz-crystal device of claim 1, wherein the excitation portion comprises a quartz-crystal vibrating piece that vibrates in a thickness-shear mode or a tuning-fork type quartz-crystal vibrating piece having a pair of vibrating arms.

3. The quartz-crystal device of claim 1, wherein the bonding surfaces by which the package base and lid are bonded together have respective surface roughness.

4. The quartz-crystal device of claim 1, wherein the quartz-crystal piece comprises a frame portion circumferentially surrounding the excitation portion and includes upper and lower bonding surfaces, the upper bonding surface of the quartz-crystal piece bonds the bonding surface of the lid and the lower bonding surface of the quartz-crystal piece bonds the bonding surface of the package base.

5. A quartz-crystal device, comprising:
    a quartz-crystal piece comprising a frame portion and an excitation portion, the frame portion circumferentially surrounding the excitation portion and including upper and lower bonding surfaces, the excitation portion having a designated surface roughness and exhibiting vibration whenever a voltage is impressed across it;
    a package base fabricated of glass or quartz crystal material, the package base comprising a floor surface, a bonding surface circumferentially surrounding the floor surface, and an outer main surface, the floor surface facing the quartz-crystal piece, and the bonding surface being bonded to the lower bonding surface of the frame portion; and
    a lid fabricated of glass or quartz crystal, the lid comprising a ceiling surface, a bonding surface circumferentially surrounding the ceiling surface, and an outer main surface, the ceiling surface facing the quartz-crystal piece, and the bonding surface being bonded to the upper bonding surface of the frame portion;
    wherein the upper main surface, ceiling surface, floor surface, and lower main surface are rougher than the surface-roughness of the excitation portion.

6. The quartz-crystal device of claim 5, wherein the lid and package base are bonded to the frame portion as respective bonds of different materials or different crystal orientations.

7. The quartz-crystal device of claim 6, wherein:
    the lid and package base are each fabricated of a unit of Z-cut quartz crystal having an X-axis, a Y-axis, and a Z-axis, and
    the quartz-crystal piece is fabricated of a unit of AT-cut quartz crystal having an X-axis, a Y'-axis, and a Z'-axis.

8. The quartz-crystal device of claim 6, wherein the quartz-crystal piece, the package base, and the lid have different respective surface-roughness.

9. The quartz-crystal device of claim 5, wherein the quartz-crystal piece, the package base, and the lid have different respective surface-roughness.

10. The quartz-crystal device of claim 5, wherein the excitation portion comprises a quartz-crystal vibrating piece that vibrates in a thickness-shear mode or a tuning-fork type quartz-crystal vibrating piece having a pair of vibrating arms.

11. A quartz-crystal device, comprising:
    a quartz-crystal piece comprising an excitation portion that vibrates whenever a voltage is impressed across the excitation portion, the vibration portion having a designated surface roughness;
    a package base fabricated of glass or quartz crystal material, the package base comprising a floor surface facing the quartz-crystal piece, a bonding surface circumferentially surrounding the floor surface, and an outer main surface, and a lid fabricated of glass quartz crystal, the lid comprising a ceiling surface facing the quartz-crystal piece, a bonding surface circumferentially surrounding the ceiling surface, and an outer main surface, and the bonding surface of the lid being bonded to the bonding surface of the package base;
    wherein the upper main surface, ceiling surface, floor surface, and lower main surface are rougher than the surface-roughness of the excitation portion.

12. The quartz-crystal device of claim 11, wherein the lid or package base and the quartz-crystal piece are different materials or different crystal orientations.

13. The quartz-crystal device of claim 12, wherein:
    the lid and package base are each fabricated of a unit of Z-cut quartz crystal having an X-axis, a Y-axis, and a Z-axis, and
    the quartz-crystal piece is fabricated of a unit of AT-cut quartz crystal having an X-axis, a Y'-axis, and a Z'-axis.

14. The quartz-crystal device of claim 12, wherein the quartz-crystal piece, the package base, and the lid have different respective surface-roughnesses.

15. The quartz-crystal device of claim 11, wherein the quartz-crystal piece, the package base, and the lid have different respective surface-roughnesses.

16. The quartz-crystal device of claim 11, wherein the excitation portion comprises a quartz-crystal vibrating piece that vibrates in a thickness-shear mode or a tuning-fork type quartz-crystal vibrating piece having a pair of vibrating arms.

* * * * *